(12) United States Patent
Kim et al.

(10) Patent No.: US 10,474,184 B2
(45) Date of Patent: Nov. 12, 2019

(54) DESIGNED WAVEFORM GENERATOR FOR SEMICONDUCTOR EQUIPMENT, PLASMA PROCESSING APPARATUS, METHOD OF CONTROLLING PLASMA PROCESSING APPARATUS, AND METHOD OF MANUFACTURING SEMICONDUCTOR DEVICE

(71) Applicant: SAMSUNG ELECTRONICS CO., LTD., Suwon-si, Gyeonggi-do (KR)

(72) Inventors: Hyun-Bae Kim, Yongin-si (KR); Sang-Yoon Soh, Yongin-si (KR); Young-Hwan Choi, Seoul (KR); Jin-Ho Kim, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 327 days.

(21) Appl. No.: 15/469,899

(22) Filed: Mar. 27, 2017

(65) Prior Publication Data

US 2018/0032100 A1 Feb. 1, 2018

(30) Foreign Application Priority Data

Jul. 26, 2016 (KR) .................. 10-2016-0094828

(51) Int. Cl.
*G06F 1/12* (2006.01)
*G06F 1/03* (2006.01)
(Continued)

(52) U.S. Cl.
CPC .............. *G06F 1/12* (2013.01); *G06F 1/0321* (2013.01); *G06F 1/06* (2013.01); *H01J 37/321* (2013.01);
(Continued)

(58) Field of Classification Search
CPC ..... H01J 37/32146; H01J 37/321; G06F 1/12; G06F 1/0321; G06F 1/06; H03K 3/02;
(Continued)

(56) References Cited

U.S. PATENT DOCUMENTS 7,749,353 B2   7/2010  Rusu et al.
7,843,087 B2 * 11/2010  Ryoo ....................... H03K 3/57
                                                   307/106
(Continued)

FOREIGN PATENT DOCUMENTS

JP   2006-196640   7/2006
KR   10-0820171    4/2008
KR   10-1587208    1/2016

*Primary Examiner* — Arnold M Kinkead
(74) *Attorney, Agent, or Firm* — F. Chau & Associates, LLC

(57) ABSTRACT

A designed waveform generator includes at least one first signal generator including a first switching device and generating a square wave having a constant voltage level during an on-period of the first switching device and at least one second signal generator including a second switching device and controlling a transition period of the second switching device to generate a variable waveform having a variable voltage level during the transition period of the second switching device. The at least one first signal generator and the at least one second signal generator are connected to each other in a cascade manner.

19 Claims, 39 Drawing Sheets

(51) Int. Cl.
*G06F 1/06* (2006.01)
*H01J 37/32* (2006.01)
*H02M 7/49* (2007.01)
*H03K 3/02* (2006.01)
*H03K 3/64* (2006.01)
*H03K 3/021* (2006.01)
*H02M 3/337* (2006.01)
*H03M 1/00* (2006.01)
*H02M 1/00* (2006.01)

(52) U.S. Cl.
CPC ............... *H02M 7/49* (2013.01); *H03K 3/02* (2013.01); *H03K 3/021* (2013.01); *H03K 3/64* (2013.01); *H02M 3/337* (2013.01); *H02M 2001/007* (2013.01); *H02M 2001/0045* (2013.01); *H02M 2001/0058* (2013.01); *Y02B 70/1491* (2013.01)

(58) Field of Classification Search
CPC .. H03K 3/64; H02M 7/49; H02M 2001/0045; H02M 2001/0058; H02M 2001/007
USPC ........................ 216/67; 156/345.28; 438/714
See application file for complete search history.

(56) References Cited

U.S. PATENT DOCUMENTS

| | | | |
|---|---|---|---|
| 8,252,193 | B2 | 8/2012 | Ui et al. |
| 8,545,670 | B2 | 10/2013 | Kojima et al. |
| 8,821,684 | B2 * | 9/2014 | Ui .................... H01J 37/32027 118/723 E |
| 9,018,983 | B2 | 4/2015 | Vankov |
| 9,194,045 | B2 | 11/2015 | Wu et al. |
| 2012/0318456 | A1 | 12/2012 | Brouk et al. |
| 2014/0361690 | A1 | 12/2014 | Yamada et al. |

* cited by examiner $I_{ref} = (V_c - V_{th})/R$

DESIGNED WAVEFORM GENERATOR FOR SEMICONDUCTOR EQUIPMENT, PLASMA PROCESSING APPARATUS, METHOD OF CONTROLLING PLASMA PROCESSING APPARATUS, AND METHOD OF MANUFACTURING SEMICONDUCTOR DEVICE

CROSS-REFERENCE TO RELATED APPLICATION

This application claims the benefit of Korean Patent Application No. 10-2016-0094828, filed on Jul. 26, 2016, in the Korean Intellectual Property Office, the disclosure of which is incorporated herein in its entirety by reference.

BACKGROUND

1. Technical Field

The inventive concept relates to a semiconductor equipment, and more particularly, to a designed waveform generator for a semiconductor equipment, a plasma processing apparatus, a method of controlling the plasma processing apparatus, and a method of manufacturing a semiconductor device.

2. Discussion of Related Art

Semiconductors are crystalline or amorphous solids with distinct electrical characteristics. Semiconductors have a resistance higher than typical resistance materials, but lower than insulators.

In general, a semiconductor is manufactured using a depositing process to deposit a thin layer and an etching process to etch the thin layer. For example, the etching is mainly performed using dry etching, which refers to the removal of material by exposing the material to a bombardment of ions. Typically the ions include reactive gases formed using a plasma reaction. However, it can be difficult to precisely control the plasma reaction.

SUMMARY

According to an exemplary embodiment of the inventive concept, there is provided a designed waveform generator for semiconductor equipment including at least one first signal generator including a first switching device and configured to generate a square wave having a constant voltage level during an on-period of the first switching device and at least one second signal generator including a second switching device and configured to control a transition period of the second switching device to generate a variable waveform having a variable voltage level during the transition period of the second switching device. The at least one first signal generator and the at least one second signal generator are connected to each other in a cascade manner.

According to an exemplary embodiment of the inventive concept, there is provided a plasma processing apparatus including a chamber, a top electrode and a bottom electrode, which are disposed in the chamber, a first power generator configured to apply a first signal to the top electrode to generate a plasma in the chamber, and a second power generator configured to apply a second signal to the bottom electrode to control an ion energy of the plasma. The second power generator includes at least one first signal generator configured to generate a square wave and at least one second signal generator configured to generate a variable waveform, and the second signal has a designed waveform corresponding to a sum of the square wave and the variable waveform. The at least one first signal generator is connected to the at least one second signal generator in a cascade manner.

According to an exemplary embodiment of the inventive concept, there is provided a method of controlling a plasma processing apparatus, including generating a first signal to generate a plasma in a chamber, generating a second signal to control an ion energy of the plasma, and applying the first and second signals to a top electrode and a bottom electrode arranged in the chamber, respectively. The generating of the second signal includes generating a square wave to provide a voltage level determined depending on a target level of the ion energy, generating a variable waveform determined depending on a target distribution of the ion energy, and combining the square wave and the variable waveform to provide the second signal having a designed waveform.

According to an exemplary embodiment of the inventive concept, there is provided a method of manufacturing a semiconductor device, including generating plasma in a chamber and performing a semiconductor process on a semiconductor wafer using the generated plasma. The generating the plasma includes generating a first signal to generate the plasma in the chamber, generating a second signal to control an ion energy of the plasma, and applying the first and second signals to a top electrode and a bottom electrode arranged in the chamber, respectively. The generating of the second signal includes generating a square wave to provide a voltage level determined depending on a target level of the ion energy, generating a variable waveform determined depending on a target distribution of the ion energy, and combining the square wave and the variable waveform to provide the second power having a designed waveform.

According to an exemplary embodiment of the inventive concept, there is provided a plasma processing apparatus including a chamber, a top electrode and a bottom electrode, which are disposed in the chamber, a first power generator configured to apply a first signal to the top electrode to generate plasma in the chamber, and a second power generator configured to apply a second signal to the bottom electrode to control ion energy of the plasma. The second power generator includes a first signal generator configured to generate a square wave, and a second signal generator configured to generate a periodic waveform having an increasing or decreasing slope. The second power generator outputs the second signal as a sum of the square wave and the waveform.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EXEMPLARY EMBODIMENTS

Hereinafter, the present inventive concept will be explained in detail with reference to the accompanying drawings.

Figure 1:
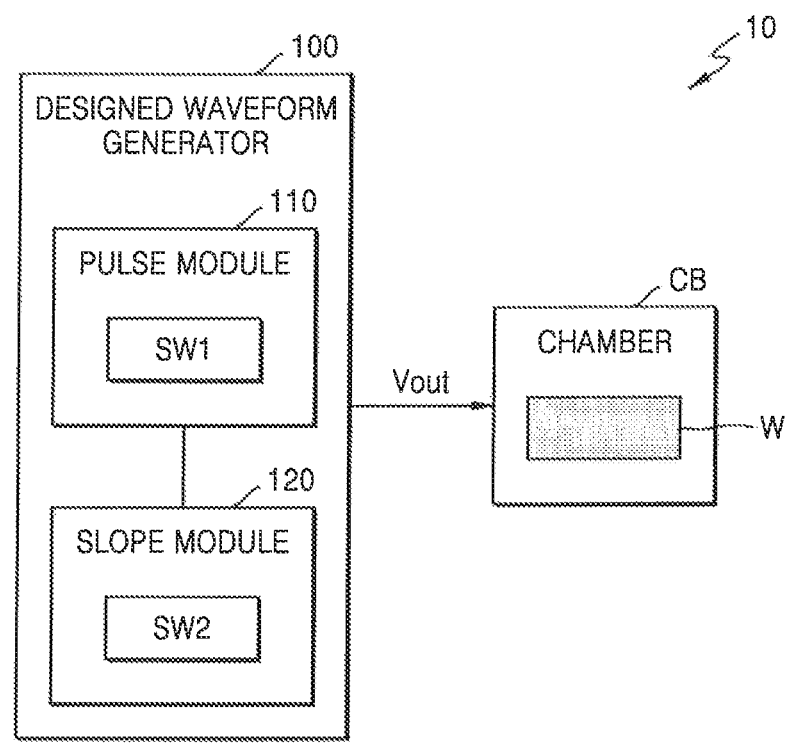
FIG. 1 is a block diagram showing semiconductor equipment according to an exemplary embodiment of the inventive concept.

FIG. 1 is a block diagram showing semiconductor equipment 10 according to an exemplary embodiment of the inventive concept. The semiconductor equipment 10 may be used to manufacture a semiconductor.

Referring to FIG. 1, the semiconductor equipment 10 includes a designed waveform generator 100 and a chamber CB. The designed waveform generator 100 generates an output voltage Vout having an arbitrary waveform (hereinafter, referred to as a "designed waveform") designed by a user and provides the generated output voltage Vout to the chamber CB. For instance, the designed waveform may have a frequency in a range from a few kHz to a few MHz or may have a variable voltage level in a range from tens of volts (V) to several tens of kilo-volts (kV). A semiconductor wafer W is loaded in the chamber CB, and a semiconductor process is performed on the semiconductor wafer W using the output voltage Vout applied to the chamber CB.

The designed waveform generator 100 includes at least one pulse module 110 generating a square wave and at least one slope module 120 generating a variable wave. The at least one pulse module 110 may be implemented as a plurality of pulse modules 110, and the at least one slope module 120 may be implemented as a plurality of slope modules 120. The number of the pulse modules 110 and the number of the slope modules 120 may be determined depending on embodiments. In an embodiment, a pulse module 110 is a circuit (e.g., a signal generator) configured to generate a signal having a square wave shape. In an embodiment, the slope module 120 is a circuit (e.g., a signal generator) configured to generate a signal having a variety of shapes (e.g., a periodic signal with an increasing/decreasing slope).

The designed waveform generator 100 has a maximum output voltage determined depending on the number of the pulse modules 110 and the number of the slope modules 120. The output voltage of the designed waveform generator 100 corresponds to a sum of a direct current (DC) voltage applied to the at least one pulse module 110 and a DC voltage applied to the at least one slope module 120. The at least one pulse module 110 is connected to the at least one slope module 120, and thus the designed waveform generator 100 provides a voltage level corresponding to the sum of the DC voltage applied to the at least one pulse module 110 and the DC voltage applied to the at least one slope module 120.

The pulse modules 110 include at least one positive pulse module generating a positive voltage and/or at least one negative pulse module generating a negative voltage. The slope modules 120 include at least one positive slope module generating a positive voltage and/or at least one negative slope module generating a negative voltage. These will be described in more detail later with reference to FIGS. 3 and 4.

In the present exemplary embodiment, the at least one pulse module 110 and the at least one slope module 120 are connected to each other in a cascade manner. Here, the cascade manner indicates a serial connection manner in which an output of one module is connected to an input of another module, and the cascade manner is referred to as a cascade connection. In an embodiment, the output of the at least one pulse module 110 is connected to the input of the at least one slope module 120, but is not limited thereto. That is, the output of the at least one slope module 120 may be connected to the input of the at least one pulse module 110.

Figure 2:
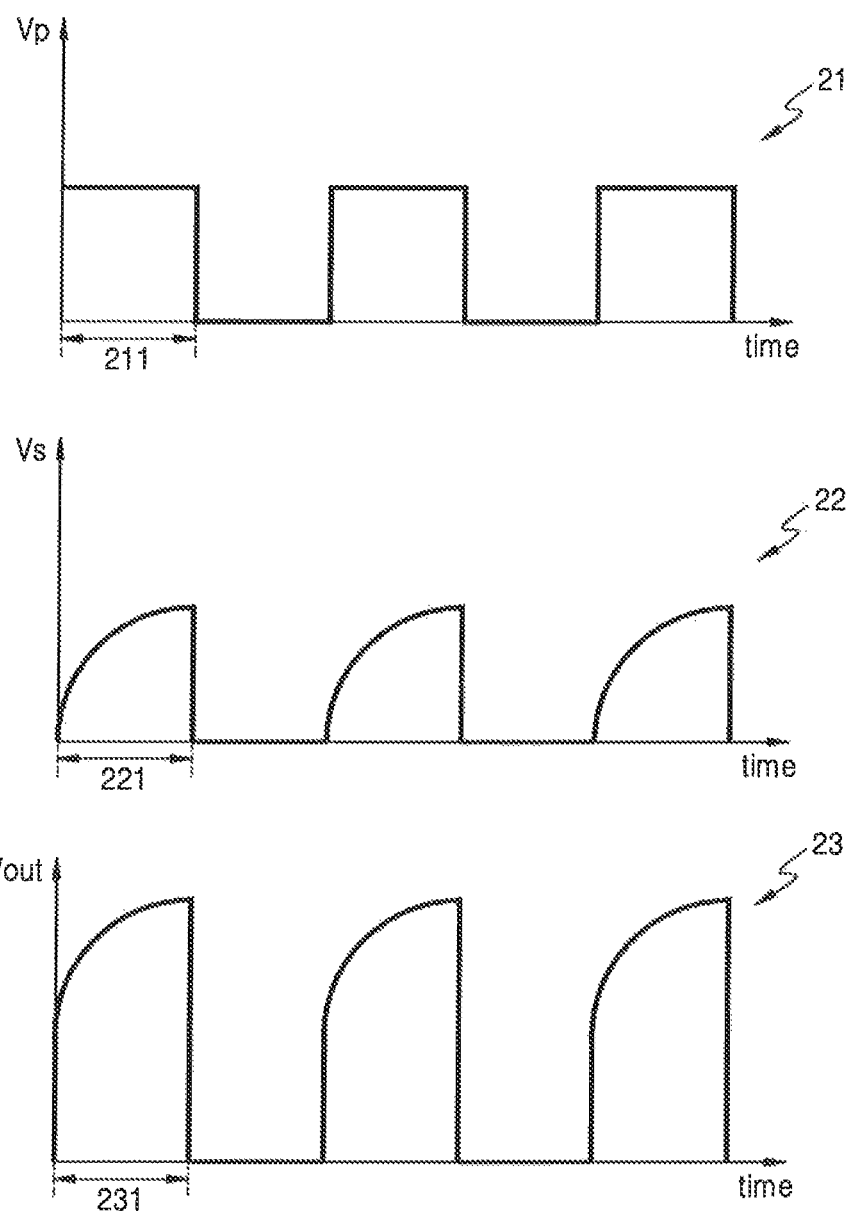
FIG. 2 is a view showing graphs respectively representing a pulse voltage, a slope voltage, and an output voltage according to an exemplary embodiment.

FIG. 2 is a view showing graphs 21, 22, and 23 respectively representing a pulse voltage, a slope voltage, and an output voltage according to an exemplary embodiment.

Referring to FIGS. 1 and 2, a horizontal axis of the graph 21 represents the time, and a vertical axis of the graph 21 represents the pulse voltage Vp. The pulse voltage Vp corresponds to the output voltage of the pulse module 110. In detail, the pulse voltage Vp corresponds to the voltage output from the pulse module 110 when the pulse module 110 is not connected to the slope module 120 or when the slope module 120 is in an inactive state. In an embodiment, the pulse module 110 includes a first switching device SW1, and the pulse voltage Vp is a square wave having a predetermined voltage level during an on-period 211 of the first switching device SW1. The pulse module 110 may generate the pulse voltage Vp with the square wave by rapidly turning on/off the first switching device SW1. For example, the high period of the pulse voltage Vp occurs when the first switching device SW1 is turned on and the low period of the pulse voltage Vp occurs when the first switching device SW1 is turned off.

A horizontal axis of the graph 22 represents the time, and a vertical axis of the graph 22 represents the slope voltage Vs. The slope voltage Vs corresponds to the output voltage of the slope module 120. In detail, the slope voltage Vs corresponds to the voltage output from the slope module 120 when the pulse module 110 is not connected to the slope module 120 or when the pulse module 110 is in an inactive state. In an embodiment, the slope module 120 includes a second switching device SW2, and the slope voltage Vs is a variable waveform having a variable voltage level during an on-period 221 of the second switching device SW2. The slope module 120 may generate the slope voltage Vs with the variable waveform by controlling a transition period of the second switching device SW2. In this case, the transition period may correspond to the on-period 221 of the second switching device SW2. In an embodiment, the transition period corresponds to a transition period of a changing state of a transistor.

A horizontal axis of the graph 23 represents the time, and a vertical axis of the graph 23 represents the output voltage Vout. The output voltage Vout corresponds to the output voltage of the designed waveform generator 100. In detail, the output voltage Vout corresponds to the voltage output from the designed waveform generator 100 when the pulse module 110 is connected to the slope module 120. In the present exemplary embodiment, since the pulse module 110 and the slope module 120 are connected to each other in the cascade manner, the designed waveform generator 100 generates the output voltage Vout having the designed waveform corresponding to a sum of the square wave and the variable waveform. In other words, the output voltage Vout corresponds to a sum of the pulse voltage Vp and the slope voltage Vs. In an embodiment, the level of the output voltage Vout is determined based on the number of the pulse modules 110 that are activated and the number of the slope modules 120 that are activated, and a shape of the output voltage Vout during an on-period 231 is determined based on the variable waveform of the slope voltage Vs. In an embodiment, the amplitude of the output voltage Vout is higher than the amplitude of the pulse voltage Vp and the slope voltage Vs. In an embodiment, the output voltage Vout is periodic, and during each period, a slope of the output voltage increases or decreases.

The first and second switching devices SW1 and SW2 may be power semiconductor devices. For example, the first and second switching devices SW1 and SW2 may be implemented by insulated gate bipolar transistors (IGBTs) or power metal oxide semiconductor field effect transistors (MOSFETs). The power semiconductor device may be used to transform or control a power supply and may be referred to as a "power device". In FIG. 2, the slope voltage Vs has the waveform in which the slope decreases as time elapses, but the waveform of the slope voltage Vs is not limited thereto. That is, according to other embodiments, the slope voltage Vs may have a waveform in which the slope increases as the time elapses, a waveform in which the slope repeatedly increases and decreases as the time elapses, or a waveform in which the slope is constant as the time elapses.

Figure 3:
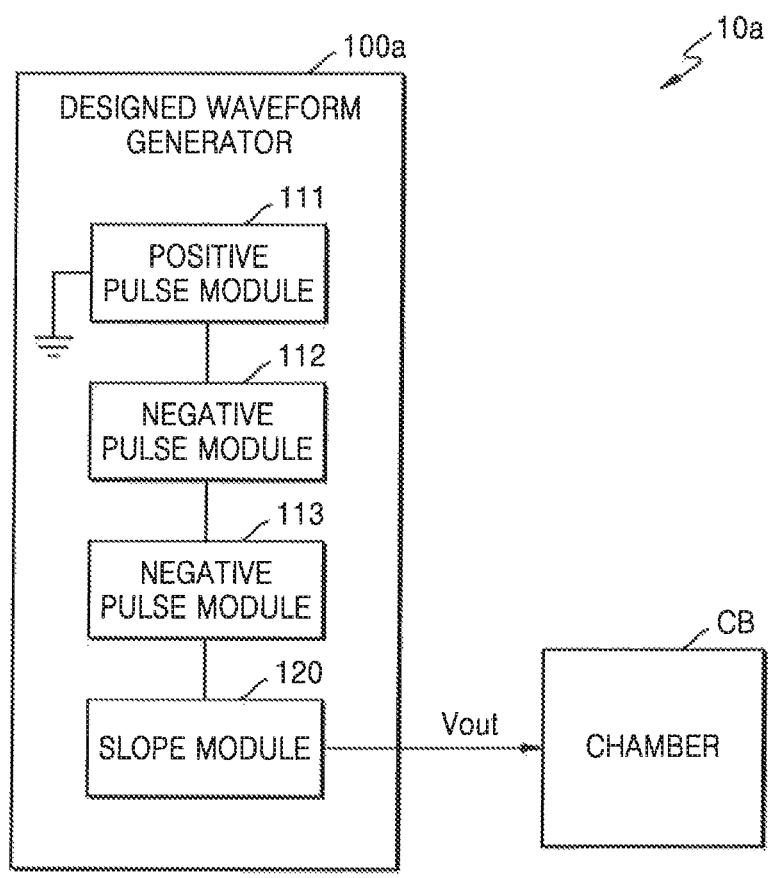
FIG. 3 is a block diagram showing a semiconductor equipment including a designed waveform generator according to an exemplary embodiment of the inventive concept.

FIG. 3 is a block diagram showing semiconductor equipment 10a including a designed waveform generator 100a according to an exemplary embodiment of the inventive concept.

Referring to FIG. 3, the semiconductor equipment 10a includes the designed waveform generator 100a and a chamber CB, and the designed waveform generator 100a corresponds to an exemplary implementation of the designed waveform generator 100 shown in FIG. 1. The designed waveform generator 100a includes a positive pulse module 111, first and second negative pulse modules 112 and 113, and a slope module 120. The positive pulse module 111 and the first and second negative pulse modules 112 and 113 are examples of the at least one pulse module 110 shown in FIG. 1.

The positive pulse module 111 generates a positive pulse voltage having positive voltage level, and the first and second negative pulse modules 112 and 113 respectively generate first and second negative pulse voltages having a negative voltage level. In an embodiment, each of the positive pulse module 111, the first negative pulse module 112, and the second negative pulse module 113 include switches connected to each other in a half-bridge structure or a full-bridge structure.

In an embodiment, each of the positive pulse module 111, the first negative pulse module 112, and the second negative pulse module 113 further include a gate driver, and the gate driver is configured to turn on/off the switches at a speed in a range from a few nanoseconds (nsec) to several hundred nanoseconds (nsec). Accordingly, the positive pulse module 111, the first negative pulse module 112, and the second negative pulse module 113 may generate the square wave. In an embodiment, the gate driver is a circuit configured to apply a signal to a gate terminal of a transistor to control turning on/off the transistor.

The slope module 120 generates a slope voltage having a variable voltage level. In an embodiment, each of the slope modules 120 include switches connected to each other in the half-bridge structure or the full-bridge structure. In an embodiment, the slope module 120 further includes a slope controller, and the slope controller controls a transition period of the switches. Thus, the slope module 120 may generate the variable waveform. This will be described in further detail with reference to FIGS. 8A and 8B.

In the present exemplary embodiment, the positive pulse module 111, the first and second negative pulse modules 112 and 113, and the slope module 120 are connected to each other in a cascade manner. In an embodiment, the positive pulse module 111, the first and second negative pulse modules 112 and 113, and the slope module 120 are applied with first, second, third, and fourth DC power sources, respectively. In an exemplary embodiment, the first to fourth DC power sources are independent power sources that do not share a ground terminal. A maximum output voltage of the designed waveform generator 100a may correspond to a sum of the first to fourth DC power sources. The output voltage of the designed waveform generator 100a may be determined in accordance with the number of activated modules among the positive pulse module 111, the first and second negative pulse modules 112 and 113, and the slope module 120. Hereinafter, configurations of the positive pulse module 111, the first and second negative pulse modules 112 and 113, and the slope module 120 will be described in more detail with reference to FIG. 4.

Figure 4:
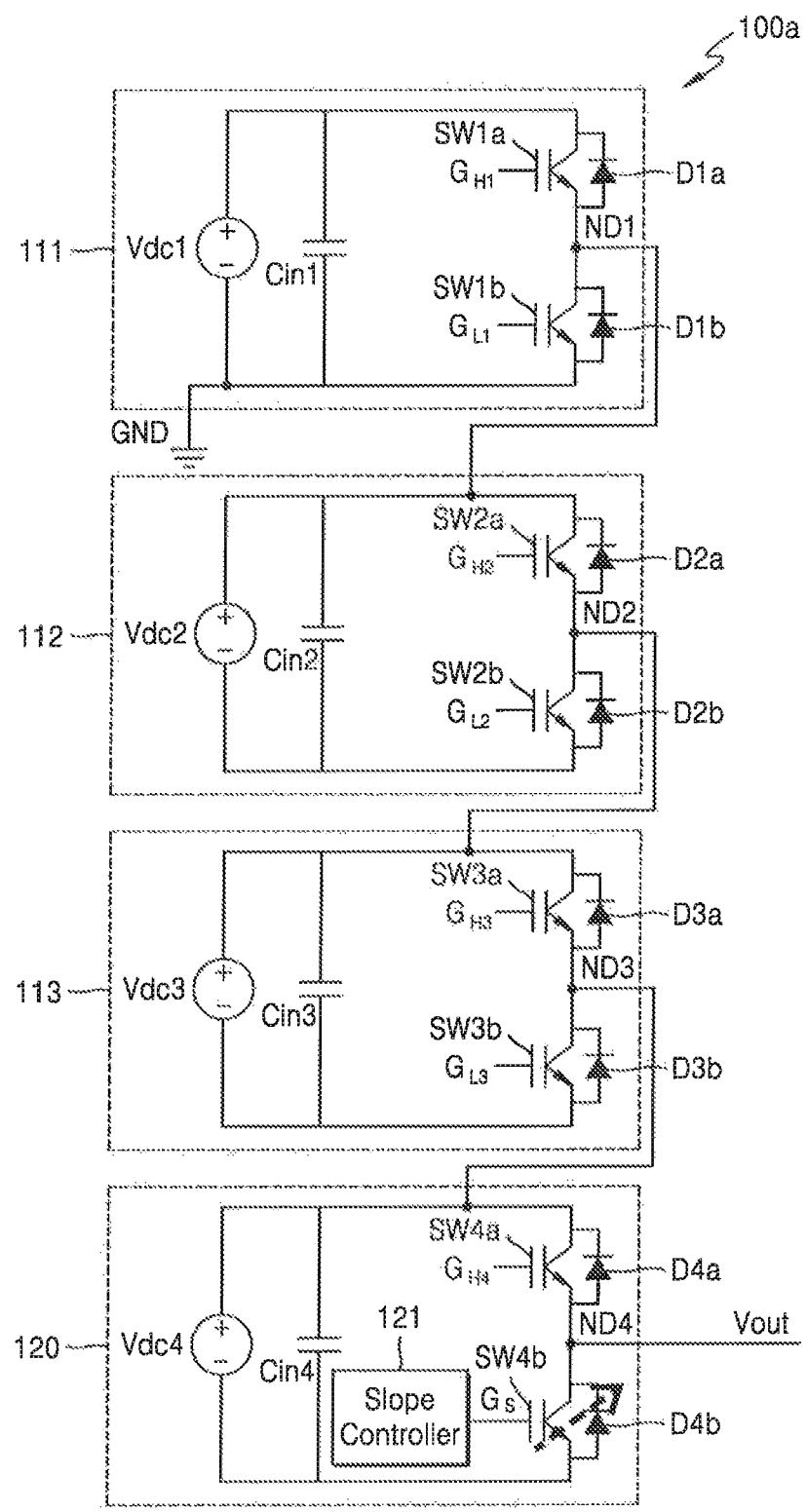
FIG. 4 is a circuit diagram showing the designed waveform generator of FIG. 3 according to an exemplary embodiment.

FIG. 4 is a circuit diagram showing the designed waveform generator 100a of FIG. 3 according to an exemplary embodiment of the inventive concept.

Referring to FIG. 4, the positive pulse module 111 includes a first DC power source Vdc1, a first switch SW1a, and a second switch SW1b. The first switch SW1a is connected between a positive terminal of the first DC power source Vdc1 and a first node ND1 and driven by a first gate driving signal $G_{H1}$. The second switch SW1b is connected between the first node ND1 and a ground terminal GND and driven by a second gate driving signal $G_{L1}$. A negative terminal of the first DC power source Vdc1 is connected to the ground terminal GND. In an embodiment, the first node ND1 is an output node of the positive pulse module 111. When the positive pulse module 111 is activated, i.e., when the first switch SW1a is turned on and the second switch SW1b is turned off, a positive voltage corresponding to the first DC power source Vdc1 is provided at the first node ND1.

The first negative pulse module 112 includes a second DC power source Vdc2, a first switch SW2a, and a second switch SW2b. The first switch SW2a is connected between the first node ND1 and a second node ND2 and driven by a first gate driving signal $G_{H2}$. The second switch SW2b is connected between the second node ND2 and a negative terminal of the second power source Vdc2 and driven by a second gate driving signal $G_{L2}$. In an embodiment, the second node ND2 is an output node of the first negative pulse module 112. When the first negative pulse module 112 is activated, i.e., when the first switch SW2a is turned off and the second switch SW2b is turned on, a voltage corresponding to a sum of a voltage of the first node ND1 and a negative voltage corresponding to the second DC power source Vdc2 is provided at the second node ND2.

The second negative pulse module 113 includes a third DC power source Vdc3, a first switch SW3a, and a second switch SW3b. The first switch SW3a is connected between the second node ND2 and a third node ND3 and driven by a first gate driving signal $G_{H3}$. The second switch SW3b is connected between the third node ND3 and a negative terminal of the third power source Vdc3 and driven by a second gate driving signal $G_{L3}$. In an embodiment, the third node ND3 is an output node of the second negative pulse module 113. When the second negative pulse module 113 is activated, i.e., when the first switch SW3a is turned off and the second switch SW3b is turned on, a voltage corresponding to a sum of a voltage of the second node ND2 and a negative voltage corresponding to the third DC power source Vdc3 is provided at the third node ND3.

In an embodiment, each of the positive pulse module 111, the first negative pulse module 112, and the second negative pulse module 113 further include a gate driver. The gate driver may turn on/off the first switches SW1a to SW3a and the second switches SW1b to SW3b at a speed in a range from a few nanoseconds (nsec) to several hundred nanoseconds (nsec). Accordingly, the first and second switches SW1a to SW3a and SW1b to SW3b may generate the square wave. In an embodiment, the gate driver provides the first and second gate driving signals $G_{H1}$ and $G_{L1}$, $G_{H2}$ and $G_{L2}$, $G_{H3}$ and $G_{L3}$. In an embodiment, the second gate driving signals $G_{L1}$, $G_{L2}$, and $G_{L3}$ are obtained by inverting the first gate driving signals $G_{H1}$, $G_{H2}$, and $G_{H3}$, respectively. In an embodiment, one or more inverters are provided to inverting the first gate driving signals. In an embodiment, each of the positive pulse module 111, the first negative pulse module 112, and the second negative pulse module 113 receive the first and second gate driving signals $G_{H1}$ and $G_{L1}$, $G_{H2}$ and $G_{L2}$, $G_{H3}$ and $G_{L3}$ from an external source, e.g., a master controller.

The slope module 120 includes a fourth DC power source Vdc4, a first switch SW4a, and a second switch SW4b. The first switch SW4a is connected between the third node ND3 and a fourth node ND4 and driven by a first gate driving signal $G_{H4}$. The second switch SW4b is connected between the fourth node ND4 and a negative terminal of the fourth power source Vdc4. In an embodiment, the fourth node ND4 is an output node of the slope module 120 and an output node of the designed waveform generator 100a. When the slope module 120 is activated, i.e., when the first switch SW4a is turned off and the second switch SW4b is turned on, a voltage corresponding to a sum of a voltage of the third node ND3 and a negative voltage corresponding to the fourth DC power source Vdc4 is provided at the fourth node ND4 as a variable voltage controlled by a slope controller 121.

In addition, the slope module 120 may further include the slope controller 121 that applies a driving signal $G_S$ to the second switch SW4b to control a transition period of the second switch SW4b. In an embodiment, the slope controller 121 drives the second switch SW4b using a current control method, and the driving signal $G_S$ may be implemented by a current. This will be described in more detail with reference to FIG. 5 later. In an embodiment, the slope of the output voltage Vout provided from the fourth node ND4 is proportional to the driving signal $G_S$, and this will be described in more detail with reference to FIGS. 8A and 8B.

In an exemplary embodiment, the positive pulse module 111, the first and second negative pulse modules 112 and 113, and the slope module 120 are connected to each other in a cascade manner. In an embodiment, the first node ND1 of the positive pulse module 111 is connected to the first switch SW2a of the first negative pulse module 112, the second node ND2 of the first negative pulse module 112 is connected to the first switch SW3a of the second negative pulse module 113, the third node ND3 of the second negative pulse module 113 is connected to the first switch SW4a of the slope module 120, and the output voltage Vout is provided at the fourth node ND4 of the slope module 120.

In an exemplary embodiment, the first to fourth DC power sources Vdc1 to Vdc4 are independent power sources that do not share a ground terminal GND. In an embodiment, the negative terminal of the first DC power source Vdc1 is connected to the ground terminal GND, and the second to fourth DC power sources Vdc2 to Vdc4 are not connected to the same ground terminal GND. Accordingly, the second to fourth DC power sources Vdc2 to Vdc4 may be referred to as floating independent power sources, and the second to fourth DC power sources Vdc2 to Vdc4 may provide floating independent voltages. In an embodiment, the first to fourth DC power sources Vdc1 to Vdc4 provide voltages with the same level (i.e., Vdc1=Vdc2=Vdc3=Vdc4), but the inventive concept is not limited thereto. However, in an alternate embodiment, the first to fourth DC power sources Vdc1 to Vdc4 provide voltages having different levels.

The positive pulse module 111, the first negative pulse module 112, the second negative pulse module 113, and the slope module 120 may respectively further include diodes D1a and D1b, D2a and D2b, D3a and D3b, and D4a and D4b. The diodes D1a to D4a and D1b to D4b may be free-wheeling diodes to prevent the switches SW1a to SW4a and SW1b to SW4b from being damaged. In an embodiment, the diodes are flyback diodes.

In addition, the positive pulse module 111, the first negative pulse module 112, the second negative pulse module 113, and the slope module 120 may respectively further include input capacitors Cin1, Cin2, Cin3, and Cin4. The input capacitors Cin1 to Cin4 serve as filters to maintain the DC voltage of the first to fourth DC power sources Vdc1 to Vdc4.

Figure 5:
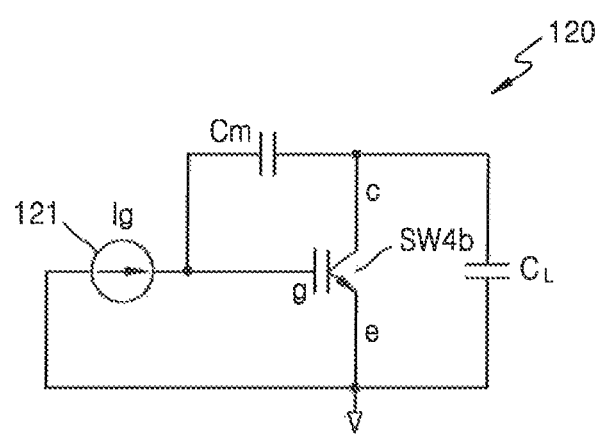
FIG. 5 is a circuit diagram showing a slope module of FIG. 4 according to an exemplary embodiment of the inventive concept.

FIG. 5 is a circuit diagram showing the slope module 120 of FIG. 4 according to an exemplary embodiment of the inventive concept.

Referring to FIG. 5, the slope module 120 may include the slope controller 121 and the second switch SW4b and may further include an internal capacitor Cm and a load capacitor $C_L$. In the present exemplary embodiment, the second switch SW4b may be, but is not limited to, an IGBT device configured to include a gate g, a collector c, and an emitter e. The internal capacitor Cm may be a gate-collector capacitor such as a Miller capacitor. In an exemplary embodiment, the slope module 120 further includes an additional capacitor connected between the gate g and the collector c.

The slope controller 121 may drive the second switch SW4b using the current control method. In an embodiment, the slope controller 121 applies the driving signal to the second switch SW4b in the form of a gate current Ig. In this embodiment, the gate current Ig is represented by the following Equation 1.

$$Ig = Cm \cdot \frac{dVgc}{dt} \quad \text{[Equation 1]}$$

In Equation 1, Vgc denotes a gate-collector voltage of the second switch SW4b, and the gate current Ig is proportional to the slope of the gate-collector voltage Vgc. In an embodiment, the slope of the gate-collector voltage Vgc is approximate to a slope of a collector-emitter voltage Vce. Accordingly, Equation 1 may be represented by the following Equation 2.

$$\frac{dVce}{dt} \approx \frac{dVgc}{dt} = \frac{1}{Cm} \cdot Ig \quad \text{[Equation 2]}$$

Thus, when the gate-collector voltage Vgc is controlled using the gate current Ig, the collector-emitter voltage Vce, i.e., the output voltage of the slope module 120, may be controlled. However, the present inventive concept is not limited to the IGBT device, and the second switch SW4b may be implemented by another power semiconductor device. In an exemplary embodiment, the slope module 120 includes a second switch implemented by the power MOSFET device. In this embodiment, a slope of a drain-source voltage Vds of the power MOSFET is approximate to a slope of a gate-drain voltage Vgd of the power MOSFET. Accordingly, when the gate-drain voltage Vgd is controlled using the gate current Ig, the drain-source voltage Vds, i.e., the output voltage of the slope module 120, may be controlled.

Figure 6:
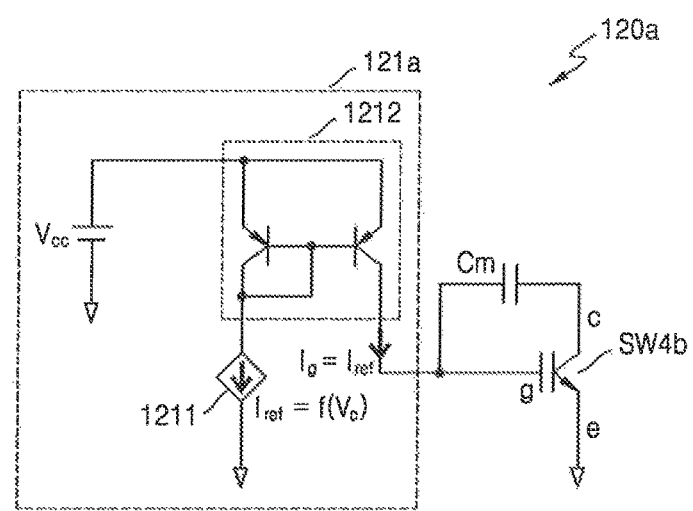
FIG. 6 is a circuit diagram showing a slope module including a slope controller according to an exemplary embodiment of the inventive concept.

FIG. 6 is a circuit diagram showing a slope module 120a including a slope controller 121a according to an exemplary embodiment of the inventive concept.

Referring to FIG. 6, the slope module 120a includes the slope controller 121a and a second switch SW4b. The slope controller 121a may be an exemplary implementation of the slope controller 121 shown in FIG. 5. The slope controller 121a includes a current source 1211 and a current mirror 1212.

The current source 1211 provides a reference current Iref generated in response to a control voltage (e.g., Vc shown in FIG. 7) generated by the slope controller 121a. The current mirror 1212 mirrors the reference current Iref to generate the gate current Ig. In FIG. 6, the current mirror 1212 includes a bipolar junction transistor (BJT), but the inventive concept is not limited thereto. In an embodiment, the BJT of the current mirror 1212 is replaced with a MOSFET device. The second switch SW4b may be driven in the current control method using the gate current Ig.

Figure 7:
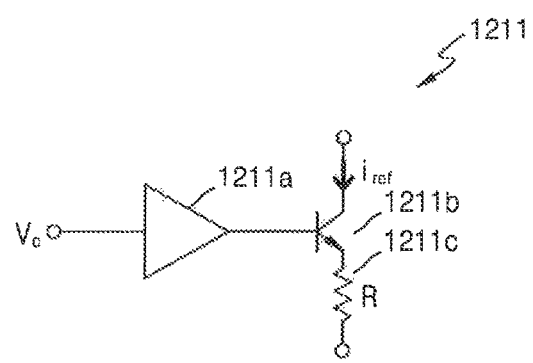
FIG. 7 is a circuit diagram showing a current source of FIG. 6 in detail according to an exemplary embodiment of the inventive concept.

FIG. 7 is a circuit diagram showing the current source 1211 of FIG. 6 in detail according to an exemplary embodiment of the inventive concept.

Referring to FIGS. 6 and 7, the current source 1211 may generate the reference current Iref based on a control voltage Vc determined depending on a target output waveform of the slope module 120a. The current source 1211 may generate the reference current Iref based on the control voltage Vc to drive the second switch SW4b in the current control method. The current source 1211 includes a buffer 1211a, a switch 1211b, and a resistor 1211c. In an embodiment, the buffer 1211a may be implemented by an operational amplifier. Hereinafter, the configuration of the current source 1211 will be described in more detail.

The buffer 1211a buffers the control voltage Vc. The control voltage Vc is generated to control a transition period of the second switch SW4b. In an embodiment, the control voltage Vc is generated by converting a digital signal having a control frequency in a range from a few kHz to several hundred MHz to an analog signal, and in this embodiment, the control frequency may be determined depending on the target output waveform of the slope module 120.

The switch 1211b is driven by the buffered control voltage, and thus the reference current Iref may flow through the switch 1211b. FIG. 7 shows a BJT device as the switch 1211b, but the switch 1211b is not limited to a BJT device. That is, the switch 1211b may be implemented by a MOSFET device. When a resistance of the resistor 1211c is R and a threshold voltage of the switch 1211b is Vth, the reference current Iref may be represented by the following Equation 3.

$$Iref = \frac{Vc - Vth}{R} \quad \text{[Equation 3]}$$

Figure 8A:
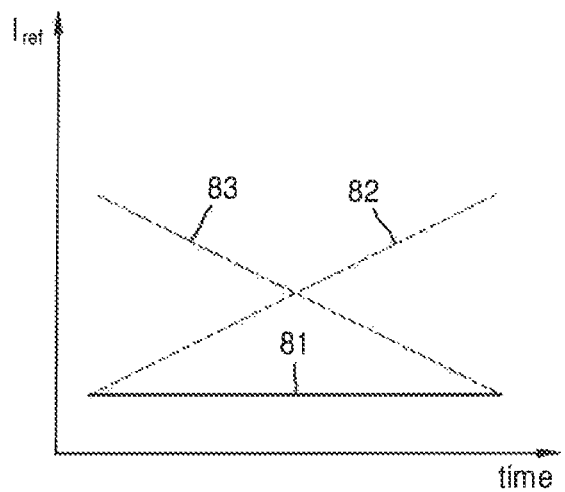
FIGS. 8A and 8B are graphs respectively showing a reference current as a function of a time and an output voltage as a function of a time according to an exemplary embodiment of the inventive concept.
Figure 8B:
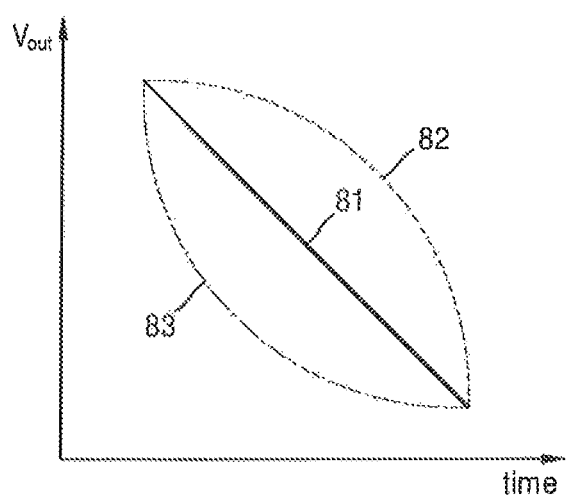

FIGS. 8A and 8B are graphs 81 and 82 respectively showing the reference current Iref as a function of a time and the output voltage Vout as a function of a time according to an exemplary embodiment. Hereinafter, a relation between the reference current Iref and the output voltage Vout will be described in detail with reference to FIGS. 4, 6, 8A, and 8B.

Referring to FIG. 8A, the reference current Iref may correspond to the reference current Iref shown in FIG. 6, and the reference current Iref may correspond to the gate current Ig. Accordingly, the reference current Iref may be used as the driving signal of the second switch SW4b. The reference current Iref is constant as time elapses during a first case 81, the reference current Iref increases as time elapses during a second case 82, and the reference current Iref decreases as the time elapses during a third case 83. However, the present inventive concept is not limited thereto. According to other embodiments, the reference current Iref may repeatedly increase and decrease as time elapses.

Referring to FIG. 8B, the output voltage Vout may correspond to the voltage of the fourth node ND4 shown in FIG. 4, and the voltage of the fourth node ND4 may correspond to the collector-emitter voltage Vce of the second switch SW4b shown in FIG. 5. In addition, since the reference current Iref may correspond to the gate current Ig, the slope (i.e., dVce/dt) of the output voltage Vout may be proportional to the reference current Iref (i.e., dVce/dt∝Iref) as represented by Equation 2.

As shown in FIG. 4, the second switch SW4b is connected to the negative terminal of the fourth DC power source Vdc4. Since the reference current Iref is constant during the first case 81, the slope of the output voltage Vout is constant, and thus the output voltage Vout decreases at a constant rate with time. Since the reference current Iref increases during the second case 82, the slope of the output voltage Vout increases with time, and thus the output voltage Vout decreases along the slope increasing as time elapses. Since the reference current Iref decreases during the third case 83, the slope of the output voltage Vout decreases with time, and thus the output voltage Vout decreases along the slope decreasing as the time elapses.

Figure 9A:
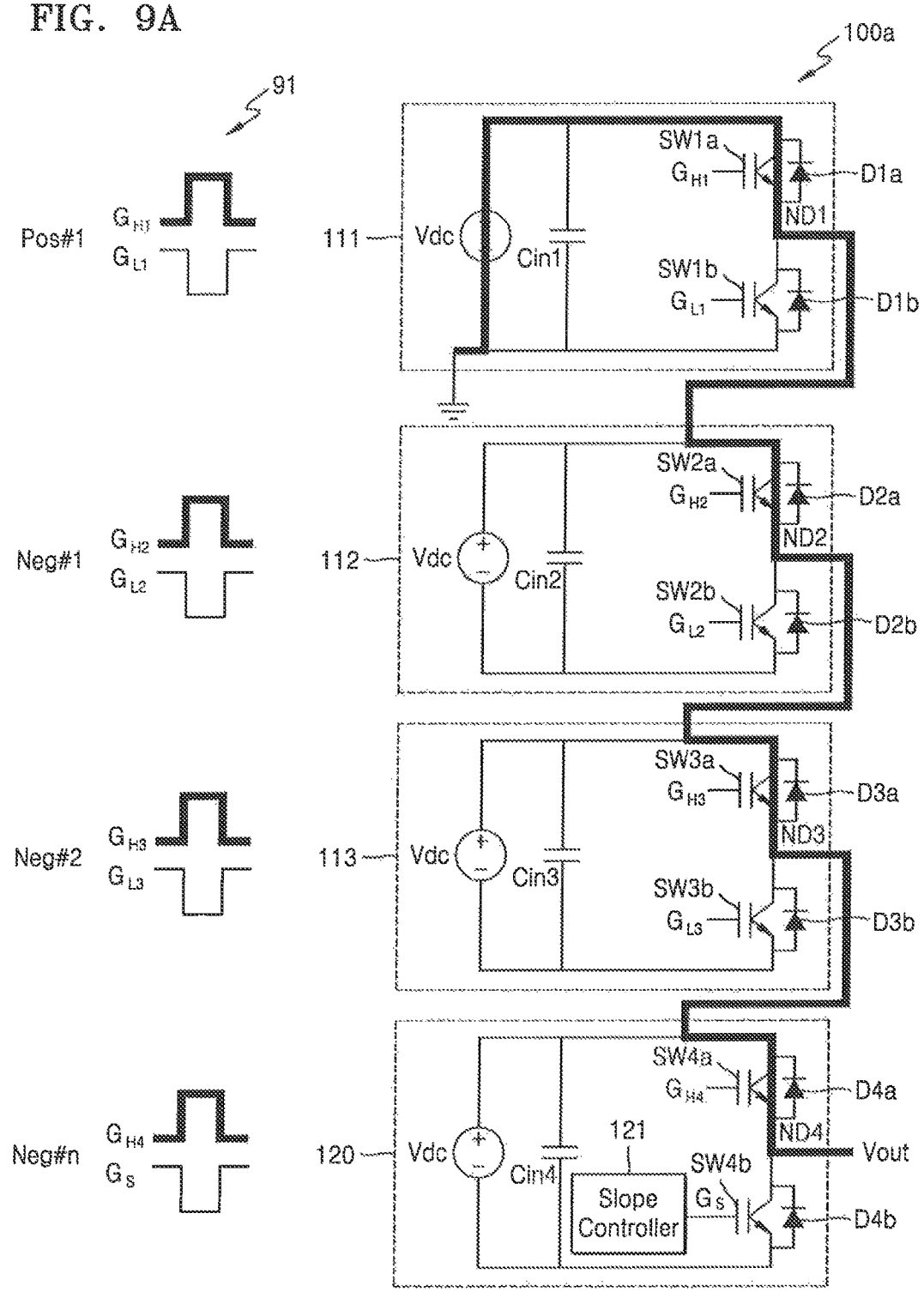
FIGS. 9A to 9C are circuit diagrams showing various driving conditions of the designed waveform generator of FIG. 4 according to an exemplary embodiment of the inventive concept.
Figure 9B:
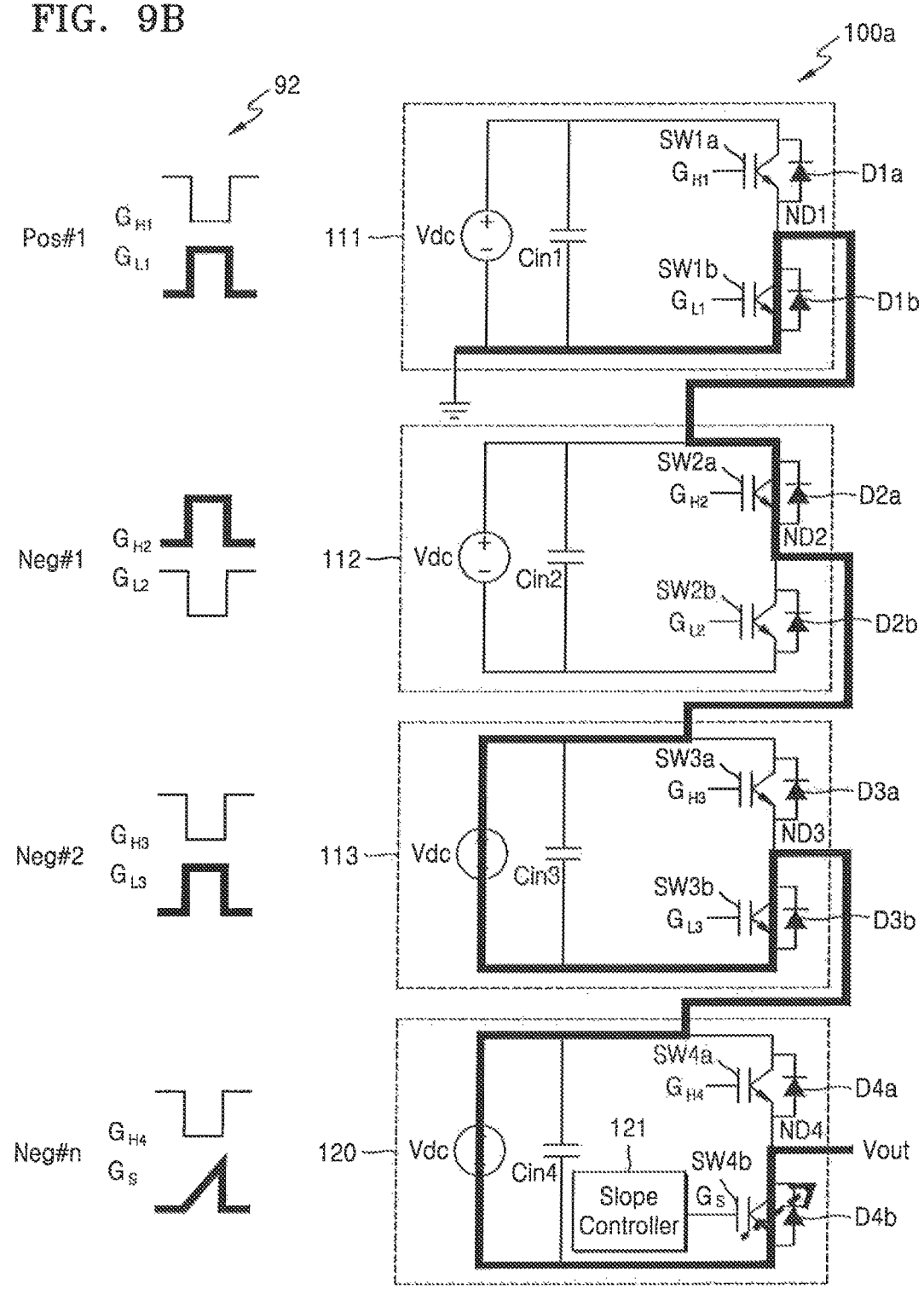
Figure 9C:
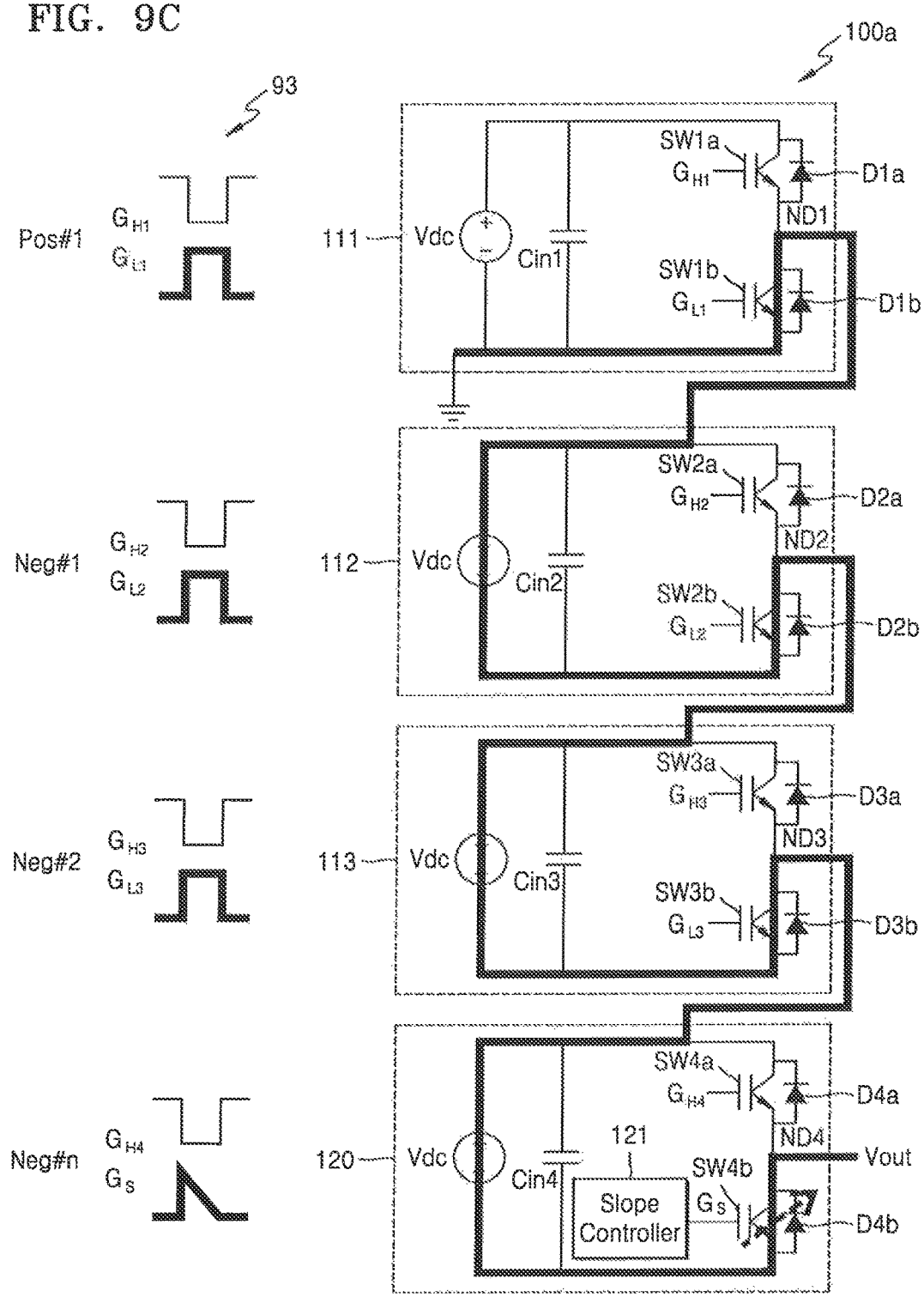

FIGS. 9A to 9C are circuit diagrams showing various driving conditions 91, 92, and 93 of the designed waveform generator 100a of FIG. 4 according to an exemplary embodiment. Hereinafter, for the convenience of explanation, it is assumed that the positive pulse module 111, the first and second negative pulse modules 112 and 113, and the slope module 120 are applied with the same DC voltage Vdc.

Referring to FIG. 9A, during the first driving condition 91, first gate driving signals $G_{H1}$ to $G_{H4}$ are activated, and second gate driving signals $G_{L1}$ to $G_{L3}$ and the slope driving signal $G_S$ are inactivated (deactivated). Since the first switch SW1a is turned on in the positive pulse module 111, the voltage level of the first node ND1 corresponds to "Vdc". Meanwhile, since the first switch SW2a is turned on in the first negative pulse module 112, the voltage level of the second node ND2 corresponds to "Vdc". Since the first switch SW3a is turned on in the second negative pulse module 113, the voltage level of the third node ND3 corresponds to "Vdc". In addition, since the first switch SW4a is turned on in the slope module 120, the voltage level of the fourth node ND4 corresponds to the "Vdc". As described above, only the positive pulse module 111 generates the output voltage in the first driving condition 91.

Referring to FIG. 9B, during the second driving condition 92, the first gate driving signal $G_{H2}$ is activated, the first gate driving signals $G_{H1}$, $G_{H3}$, and $G_{H4}$ are inactivated, the second gate driving signals $G_{L1}$ and $G_{L3}$ and the slope driving signal $G_S$ are activated, and the second gate driving signal $G_{L2}$ is inactivated. Since the second switch SW1b is turned on in the positive pulse module 111, the voltage level of the first node ND1 corresponds to "0", and since the first switch SW2a is turned on in the first negative pulse module 112, the voltage level of the second node ND2 corresponds to "0". Meanwhile, since the second switch SW3b is turned on in the second negative pulse module 113, the voltage level of the third node ND3 corresponds to "−Vdc", and since the second switch SW4b is turned on in the slope module 120, the voltage level of the fourth node ND4 has the variable waveform in accordance with the control of the slope controller 121 and may be reduced to "−2 Vdc" from "−Vdc". As described above, only the second negative pulse module 113 and the slope module 120 generate the output voltage in the second driving condition 92.

Referring to FIG. 9C, during the third driving condition 93, the first gate driving signals $G_{H1}$ to $G_{H4}$ are inactivated, and the second gate driving signals $G_{L1}$ to $G_{L3}$ and the slope driving signal $G_S$ are activated. Since the second switch SW1b is turned on in the positive pulse module 111, the voltage level of the first node ND1 corresponds to "0". Meanwhile, since the second switch SW2b is turned on in the first negative pulse module 112, the voltage level of the second node ND1 corresponds to "−Vdc". Since the second switch SW3b is turned on in the second negative pulse module 113, the voltage level of the third node ND3 corresponds to "−2 Vdc", and since the second switch SW4b is turned on in the slope module 120, the voltage level of the fourth node ND4 has the variable waveform in accordance with the control of the slope controller 121 and may be reduced to "−3 Vdc" from "−2 Vdc". As described above, only the first and second negative pulse modules 112 and 113 and the slope module 120 generate the output voltage in the third driving condition 93.

Figure 10:
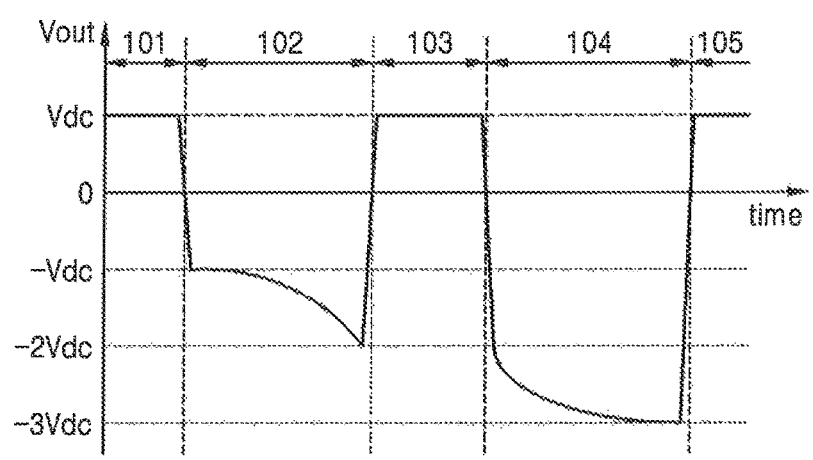
FIG. 10 is a graph showing an output voltage as a function of a time in the various driving conditions shown in FIGS. 9A to 9C.

FIG. 10 is a graph showing an output voltage Vout as a function of a time in the various driving conditions 91 to 93 shown in FIGS. 9A to 9C.

Referring to FIGS. 9A to 9C and 10, a horizontal axis represents the time, and a vertical axis represents the output voltage Vout. For instance, the output voltage Vout may correspond to the voltage of the fourth node ND4 of the designed waveform generator 100a shown in FIGS. 9A to 9C. During first, third, and fifth periods 101, 103, and 105, the designed waveform generator 100a is driven in accordance with the first driving condition 91, and the output voltage Vout corresponds to "Vdc" that is the output voltage of the positive pulse module 111.

During a second period 102, the designed waveform generator 100a is driven in accordance with the second driving condition 92. In the second driving condition 92, the output voltage Vout of the designed waveform generator 100a corresponds to a sum of the output voltage of the second negative pulse module 113 and the output voltage of the slope module 120. In an embodiment, the slope controller 121 applies the driving signal $G_S$ increasing with the time to the second switch SW4b in the second driving condition 92. Accordingly, the slope of the output voltage Vout increases with time.

During a fourth period 104, the designed waveform generator 100a is driven in accordance with the third driving condition 93. In the third driving condition 93, the output voltage Vout of the designed waveform generator 100a corresponds to a sum of the output voltages of the first and second negative pulse modules 112 and 113 and the output voltage of the slope module 120. In an embodiment, the slope controller 121 applies the driving signal $G_S$ decreasing with time to the second switch SW4b in the third driving condition 93. Accordingly, the slope of the output voltage Vout decreases with time.

Figure 11:
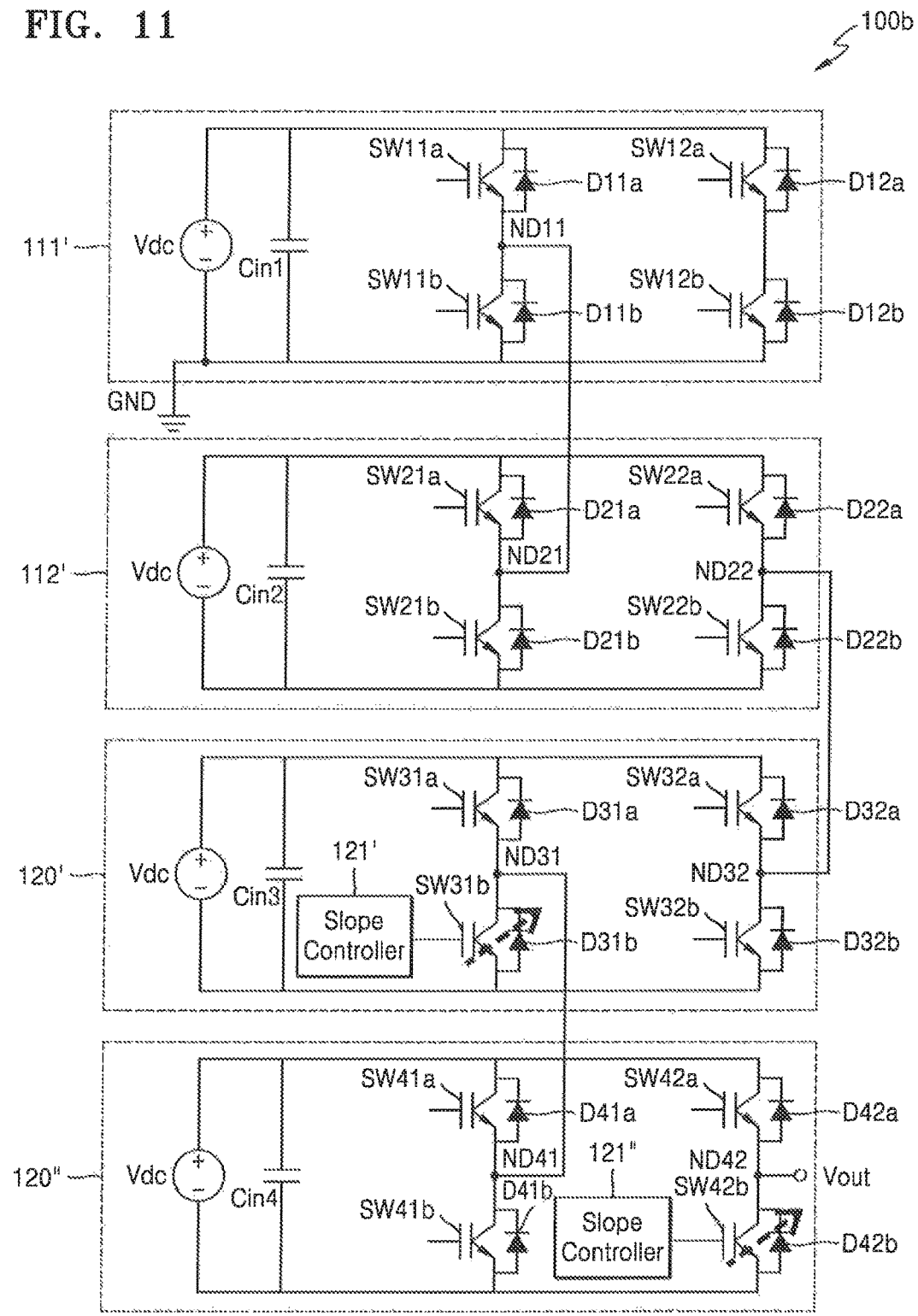
FIG. 11 is a circuit diagram showing a designed waveform generator according to an exemplary embodiment of the inventive concept.

FIG. 11 is a circuit diagram showing a designed waveform generator 100b according to an exemplary embodiment of the inventive concept.

Referring to FIG. 11, the designed waveform generator 100b may be an exemplary implementation of the designed waveform generator 100 shown in FIG. 1. The designed waveform generator 100b includes a positive pulse module 111', a negative pulse module 112', and first and second slope modules 120' and 120". The designed waveform generator 100b may correspond to a modified embodiment of the designed waveform generator 100a shown in FIG. 4. Each of the positive pulse module 111', the negative pulse module 112', and the first and second slope modules 120' and 120" include switches connected to each other in a full-bridge structure. The above explanation described with reference to FIGS. 1 to 8B may be applied to the present exemplary embodiment.

The positive pulse module 111' includes a pair of first switches SW11a and SW11b, a pair of second switches SW12a and SW12b, a pair of first diodes D11a and D11b, and a pair of second diodes D12a and D12b. The negative pulse module 112' includes a pair of first switches SW21a and SW21b, a pair of second switches SW22a and SW22b, a pair of first diodes D21a and D21b, and a pair of second diodes D22a and D22b. The first slope module 120' includes a pair of first switches SW31a and SW31b, a pair of second switches SW32a and SW32b, a pair of first diodes D31a and D31b, a pair of second diodes D32a and D32b, and a slope controller 121'. The second slope module 120" includes a pair of first switches SW41a and SW41b, a pair of second switches SW42a and SW42b, a pair of first diodes D41a and D41b, a pair of second diodes D42a and D42b, and a slope controller 121". A node ND11 is connected to a node ND21, a node ND22 is connected to a node ND32, a node ND31 is connected to a node ND41, and a node ND42 provides the output voltage Vout.

Figure 12A:
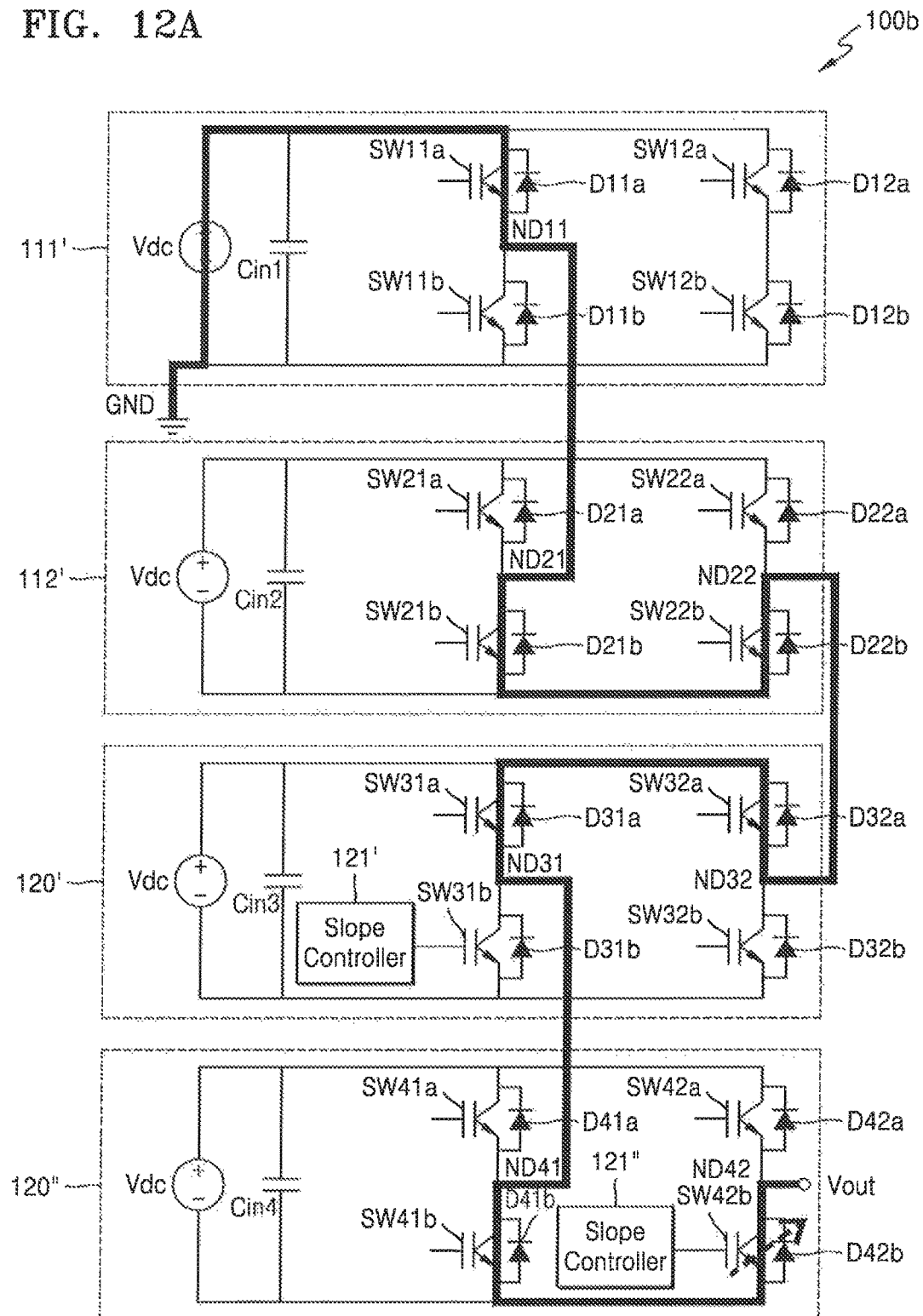
FIGS. 12A to 12C are circuit diagrams showing various driving conditions of a designed waveform generator according to an exemplary embodiment of the inventive concept.
Figure 12B:
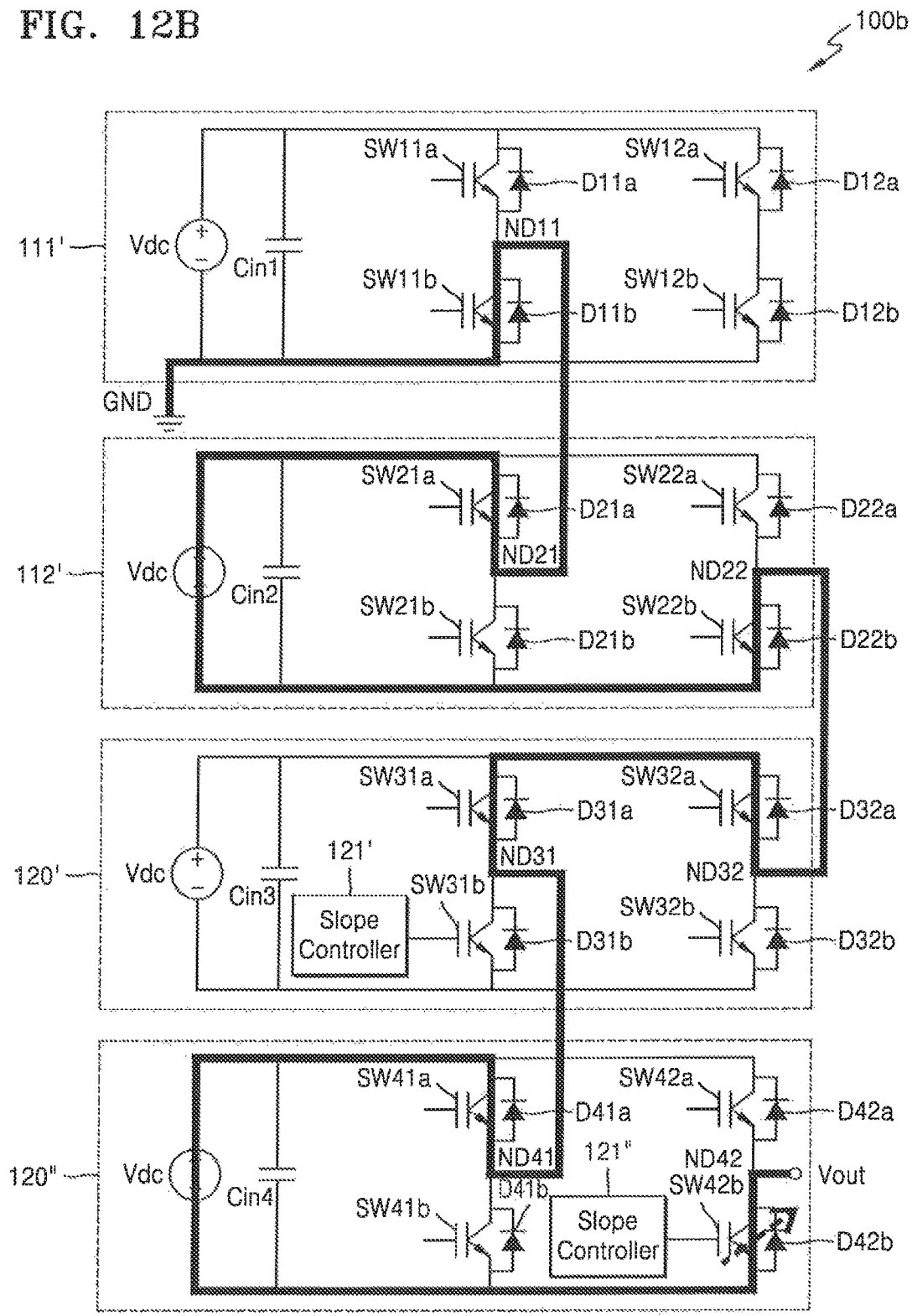
Figure 12C:
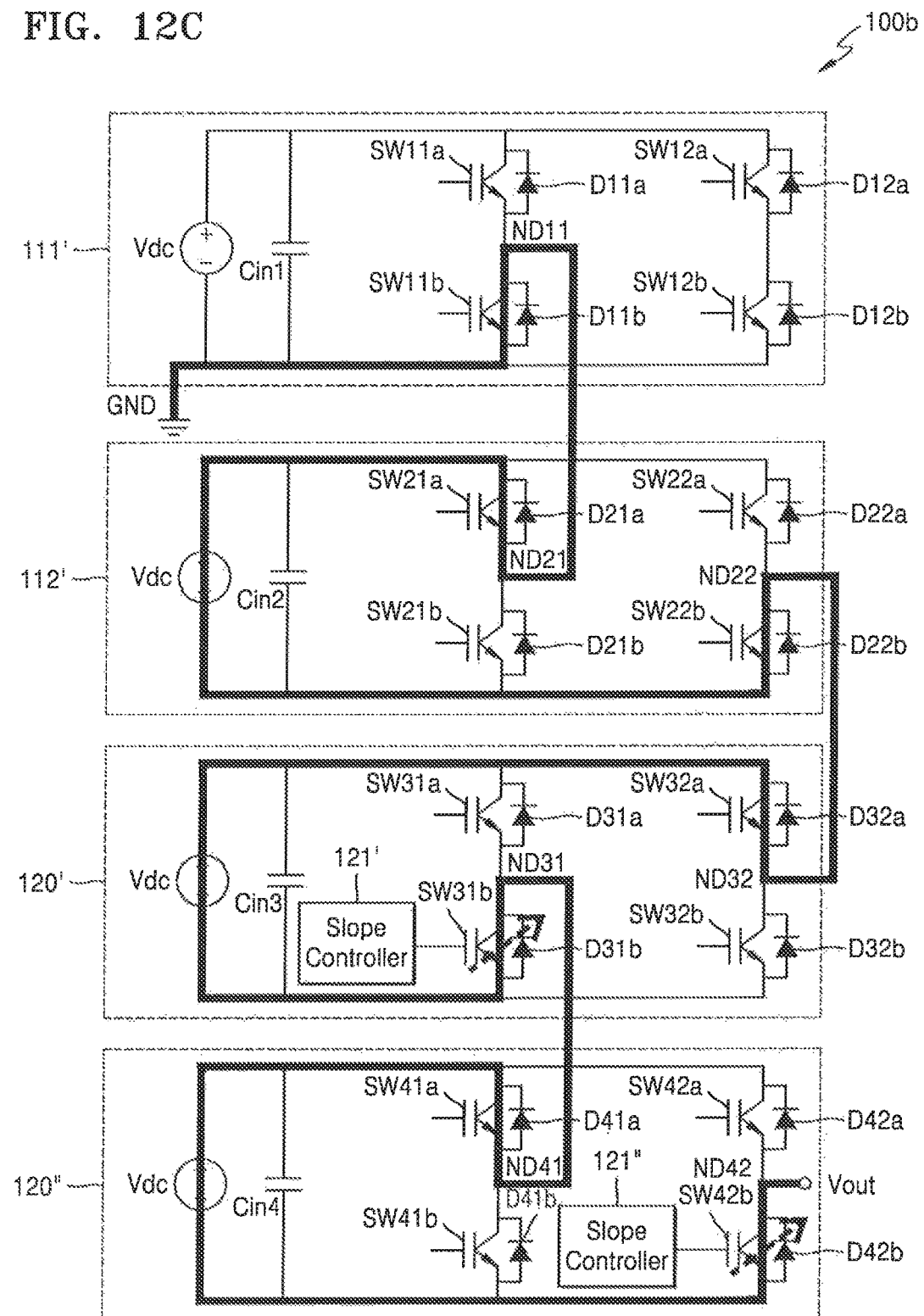

FIGS. 12A to 12C are circuit diagrams showing various driving conditions of the designed waveform generator 100b of FIG. 11.

Referring to FIG. 12A, only the positive pulse module 111' generates the output voltage in the first driving condition, and the output of each of the negative pulse module 112' and the first and second slope modules 120' and 120" are controlled to zero (0) in the first driving condition. Referring to FIG. 12B, only the negative pulse module 112' and the second slope module 120" generate the output voltage in the second driving condition, and the output of each of the positive pulse module 111' and the first slope module 120' are controlled to zero (0) in the second driving condition. In this case, the square wave may be generated by the negative pulse module 112', and the variable waveform may be generated by the second slope module 120". Referring to FIG. 12C, only the negative pulse module 112' and the first and second slope modules 120' and 120" generate the output voltage in the third driving condition, and the output of the positive pulse module 111' is controlled to zero (0) in the third driving condition. In this case, the square wave may be generated by the negative pulse module 112', and the variable waveform may be generated by the first and second slope modules 120' and 120".

Figure 13:
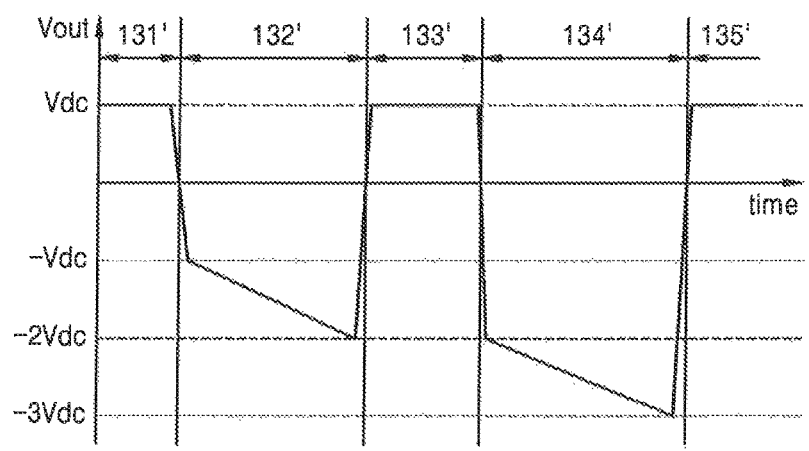
FIG. 13 is a graph showing an output voltage as a function of a time in the various driving conditions shown in FIGS. 12A to 12C.

FIG. 13 is a graph showing an output voltage as a function of a time in the various driving conditions shown in FIGS. 12A to 12C.

Referring to FIGS. 12A to 12C and 13, a horizontal axis represents time, and a vertical axis represents the output voltage Vout. For instance, the output voltage Vout may correspond to a voltage of a node ND42 of the designed waveform generator 100b shown in FIGS. 12A to 12C. During first, third, and fifth periods 131', 133', and 135', the designed waveform generator 100b is driven in accordance with the first driving condition shown in FIG. 12A, and the output voltage Vout corresponds to "Vdc" that is the output voltage of the positive pulse module 111'. During a second period 132', the designed waveform generator 100b is driven in accordance with the second driving condition shown in FIG. 12B. In the second driving condition, the output voltage Vout of the designed waveform generator 100b corresponds to a sum of the output voltage of the negative pulse module 112' and the output voltage of the second slope module 120". During a fourth period 134', the designed waveform generator 100b is driven in accordance with the third driving condition shown in FIG. 12C. In the third driving condition, the output voltage Vout of the designed waveform generator 100b corresponds to a sum of the output voltages of the negative pulse modules 112' and the output voltages of the first and second slope modules 120' and 120".

Figure 14:
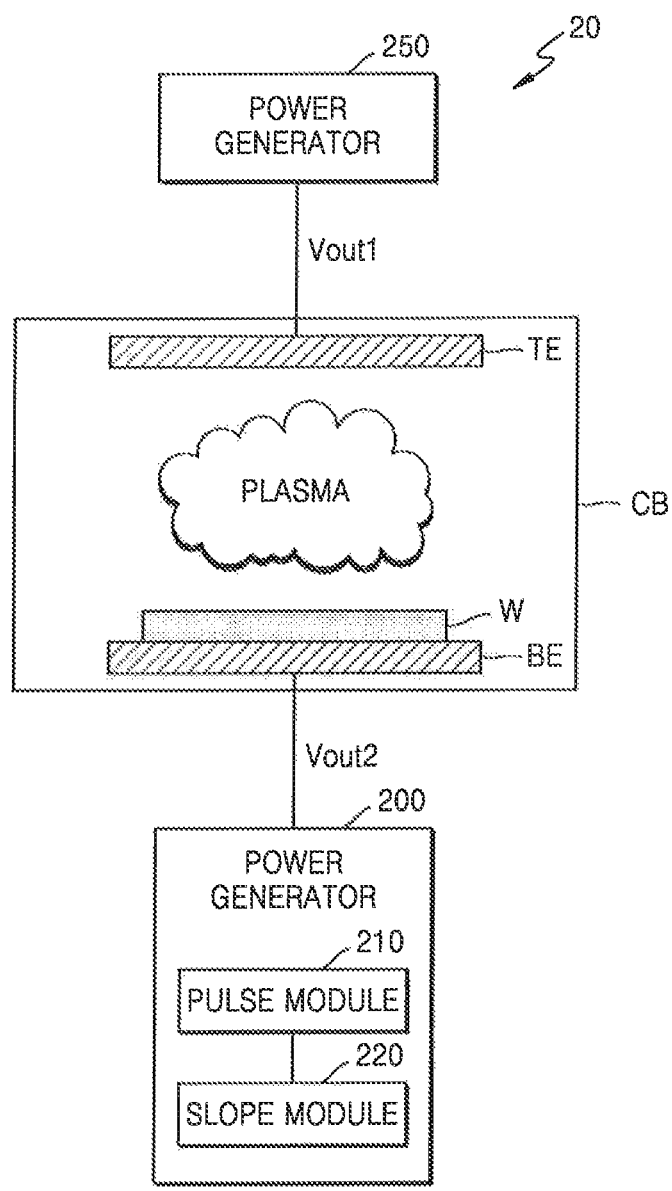
FIG. 14 is a block diagram showing a plasma processing apparatus according to an exemplary embodiment of the inventive concept.

FIG. 14 is a block diagram showing a plasma processing apparatus 20 according to an exemplary embodiment of the inventive concept.

Referring to FIG. 14, the plasma processing apparatus 20 includes a chamber CB, a first power generator 250, and a second power generator 200. A top electrode TE may be disposed at an upper portion of the chamber CB, a bottom electrode BE may be disposed at a lower portion of the chamber CB, and a wafer W may be disposed above or on top of the bottom electrode BE. In an embodiment, the bottom electrode BE is an electrostatic chuck electrostatic chuck (ESC) absorbing and supporting the wafer W using an electrostatic force. In an embodiment, the chamber CB includes a gas supply and a gas discharge. The gas supply may supply a reaction gas into the chamber CB. In an embodiment, the chamber CB is maintained in a vacuum state by discharging the gas through the gate discharge.

The first power generator 250 generates a first power (e.g., a first signal) and applies the generated first power to the top electrode TE. The first power may be used to generate plasma and may be referred to as a "source power". In an embodiment, the first power is a radio frequency (RF) power, and the first power generator 250 is referred to as an RF generator, but the inventive concept is not limited thereto. For example, the first power generator 250 may be implemented as the designed waveform generator 100 shown in FIG. 1 or the designed waveform generator 100a shown in FIG. 3.

The second power generator 200 generates a second power (e.g., a second signal) and applies the generated second power to the bottom electrode BE. The second power may be used to control an ion energy of the plasma and may be referred to as a "bias power". When the second power is applied to the bottom electrode BE, a voltage may be induced to the wafer W disposed on the bottom electrode BE. Accordingly, the voltage of the wafer W may be controlled by the second power, and thus the ion energy of the plasma generated in the chamber CB may be controlled.

In an exemplary embodiment, the second power generator 200 generates an arbitrary waveform, i.e., the designed waveform, having a high voltage and a high frequency set by a user. For instance, the second power generator 200 may generate the arbitrary designed waveform that is output at a frequency of from a few kHz to a few MHz and has a voltage level of from several tens of volts to several tens of kilovolts. The second power generator 200 may be implemented by the designed waveform generator 100 shown in FIG. 1 or the designed waveform generator 100a shown in FIG. 3. The above-described explanations with reference to FIGS. 1 to 10 may be applied to the second power generator 200.

In an embodiment, the second power generator 200 includes at least one pulse module 210 and at least one slope module 220, and the at least one pulse module 210 and the at least one slope module 220 are connected to each other in a cascade manner. In an embodiment, the at least one pulse module 210 generates a square wave, and the at least one slope module 220 generates a variable waveform. In an embodiment, a DC voltage applied to the at least one pulse module 210 and a DC voltage applied to the at least one slope module 220 are independent power sources that do not share a ground.

In an embodiment, the at least one slope module 220 includes a switching device and controls a transition period of the switching device, and thus the at least one slope module 220 generates the variable waveform having a variable voltage level in an on-period of the switching device. In an embodiment, the at least one slope module 220 further includes a slope controller (e.g., 121 of FIG. 4) applying a driving signal to the switching device to control the transition period of the switching device. In an embodiment, a slope of the variable waveform is proportional to the driving signal. In an embodiment, the slope controller drives the switching device using a current control method.

The at least one pulse module 210 may be implemented by a plurality of pulse modules, and the at least one slope module 220 may be implemented by a plurality of slope modules. An intensity of the ion energy may be determined depending on the number of the pulse modules 210 and the number of the slope modules 220. Accordingly, the number of the activated pulse modules among the pulse modules 210 and the number of the activated slope modules among the slope modules 220 may be determined according to a target intensity of the ion energy. For instance, as an output voltage Vout2 of the second power generator 200 increases, the ion energy increases.

In addition, a distribution of the ion energy may be determined in accordance with the variable waveform output from the at least one slope module 220. Accordingly, the driving signal $G_S$ generated by the slope controller (e.g., 121 of FIG. 4) in the at least one slope module 220 may be controlled in accordance with a target distribution of the ion energy, and thus the variable waveform output from the at least one slope module 220 may be changed. For instance, a dispersion of the ion energy over a wide or narrow area may be determined in accordance with the output voltage Vout2 of the second power generator 200.

According to an exemplary embodiment, the plasma processing apparatus 20 further includes a filter disposed between the second power generator 200 and the bottom electrode BE. The filter may block the first power to prevent the first power generated by the first power generator 250 from being applied to the second power generator 200 and may transmit the second power to allow the second power generated by the second power generator 200 to be applied to the bottom electrode BE. In detail, the filter may remove a frequency component of the RF power generated by the first power generator 250. For instance, the filter may be configured to include a low pass filter, a band stop filter, or a combination of the low pass filter and the band stop filter.

According to an exemplary embodiment, the plasma processing apparatus 20 further includes a filter disposed between the first power generator 250 and the top electrode TE. In an embodiment, the filter blocks the second power to prevent the second power generated by the second power generator 200 from being applied to the first power generator 250 and transmits the first power to allow the first power generated by the first power generator 250 to be applied to the top electrode TE. For instance, the filter may be configured to include a low pass filter, a band stop filter, or a combination of the low pass filter and the band stop filter.

The reaction gas may be dispersed in the chamber CB and converted to the plasma by the first power provided through the top electrode TE and the second power provided through the bottom electrode BE. The plasma may make contact with a surface of the wafer W to physically and chemically react with the wafer W, and a wafer processing process, such as a plasma annealing process, an etching process, a plasma enhanced chemical vapor deposition process, a physical vapor deposition process, a plasma cleaning process, etc., may be performed through the above-mentioned reaction.

When the plasma processing apparatus 20 is used in the etching process, the reaction gas becomes plasma due to a high frequency discharge occurring between the bottom electrode BE and the top electrode TE, and a processed layer on the wafer W is etched into a desired pattern by radicals, electrons, and ions, which are activated by the plasma. According to an exemplary embodiment, when the radicals, electrons, and ions of the plasma are precisely controlled, an etching performance, such as an etching rate, an aspect ratio, a critical dimension of the etching pattern, a profile of the etching pattern, an etching selectivity, etc., may be improved. Hereinafter, a case where the plasma processing apparatus 20 is used in the etching process will be described in detail, but the inventive concept is not limited thereto. The plasma processing apparatus 20 or the second power generator according to the embodiments may be used in any semiconductor equipment.

Figure 15A:
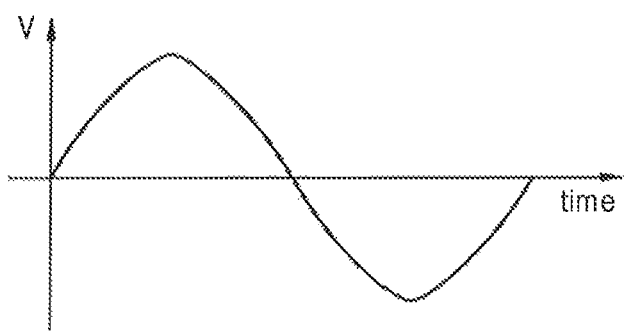
FIGS. 15A to 15C are views respectively showing an output voltage of a radio frequency (RF) generator as a function of a time, an ion energy distribution, and an etching process according to a comparison example.
Figure 15B:
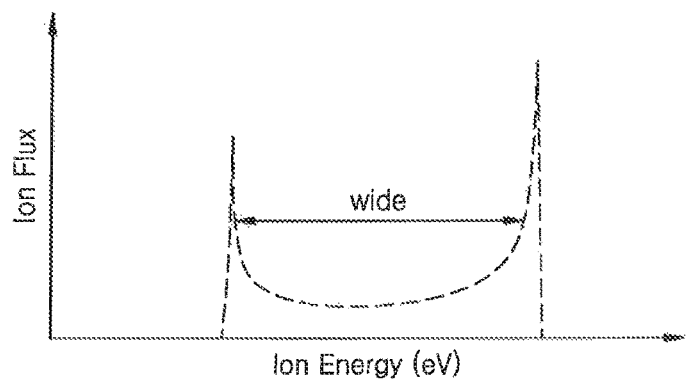
Figure 15C:
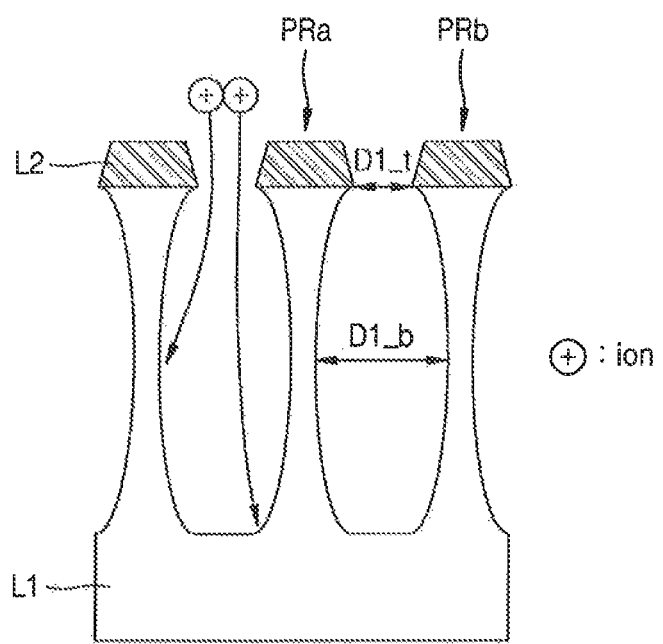

FIGS. 15A to 15C are views respectively showing an output voltage of a radio frequency (RF) generator as a function of a time, an ion energy distribution, and an etching process, when the RF power is applied to a bottom electrode of a plasma processing apparatus, according to a comparative example.

Referring to FIG. 15A, the RF power is applied to the top electrode and the bottom electrode in the chamber, and thus the plasma may be generated in the chamber. In this case, the RF power may be generated having a sine wave shape shown in FIG. 15A. Referring to FIG. 15B, when the RF power is applied to the top electrode and the bottom electrode in the chamber, a distribution of ion flux according to the ion energy of the plasma may appear over a wide area. As described above, when the RF power is applied to the bottom electrode in the chamber, it may be difficult to control the ion energy of the plasma.

Referring to FIG. 15C, an etching process is performed on a semiconductor structure including a first semiconductor layer L1 and a second semiconductor layer L2 to form a plurality of protrusions PRa and PRb. In the ion energy distribution shown in FIG. 15B, a linearity of low-energy ions having low energy is low, and a moving distance of the low-energy ions is short. As a result, a bowing phenomenon may occur in the etching process performed on the semiconductor structure. In this case, a difference between an upper distance D1_t between the protrusions PRa and PRb and a lower distance D1_b between the protrusions PRa and PRb is relatively great.

Figure 16A:
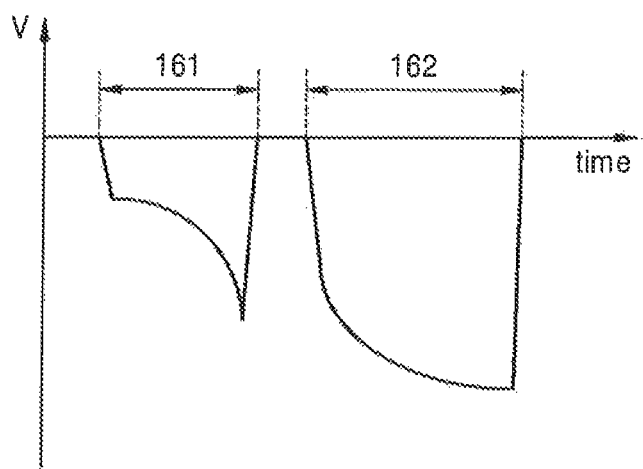
FIGS. 16A to 16C are views respectively showing an output voltage of a power generator shown in FIG. 14 as a function of a time, an ion energy distribution, and an etching process according to an exemplary embodiment.
Figure 16B:
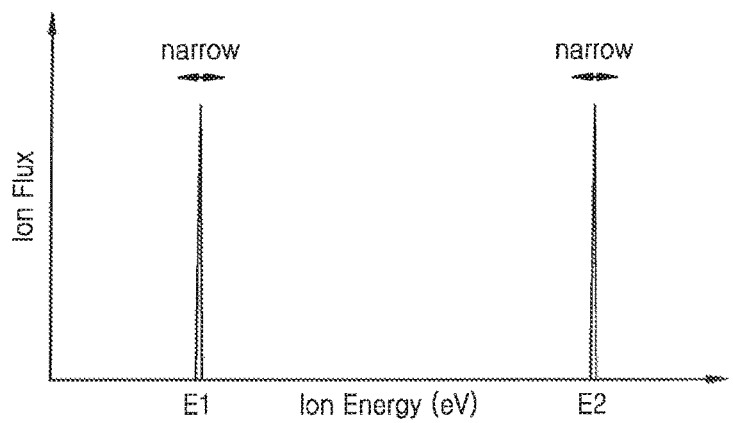
Figure 16C:
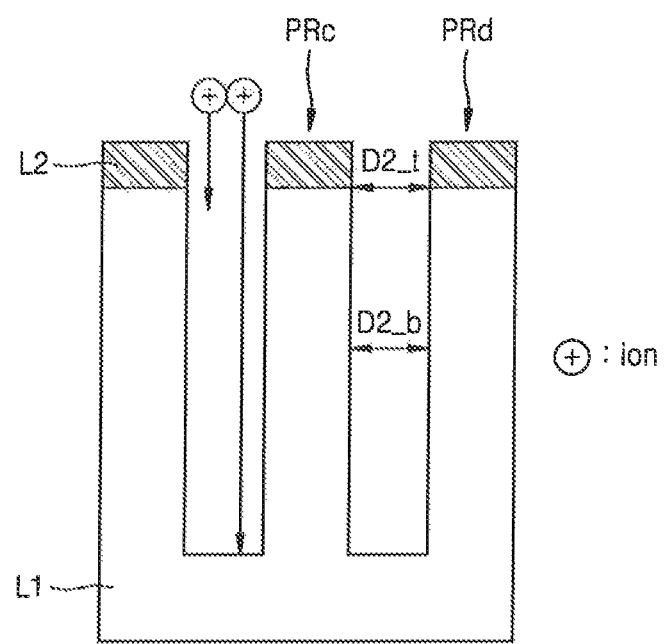

FIGS. 16A to 16C are views respectively showing an output voltage of the power generator 200 shown in FIG. 14 as a function of a time, an ion energy distribution, and an etching process according to an exemplary embodiment.

Referring to FIGS. 14 and 16A, when the RF power is applied to the top electrode TE in the chamber CB and the designed waveform is applied to the bottom electrode BE in the chamber, the plasma may be generated in the chamber CB. In an embodiment, the second power generator 200 generates the output voltage having the designed waveform in which the voltage level is variable according to time during at least a portion of a period, and the first power generator 250 generates the output voltage having the sine wave shape shown in FIG. 15A. In a first period 161, the level of the output voltage is reduced as the time elapses, and the slope of the output voltage increases as the time elapses. In a second period 162, the level of the output voltage is reduced as the time elapses, and the slope of the output voltage decreases as the time elapses.

Referring to FIG. 16B, when the designed waveform is applied to the bottom electrode BE in the chamber CB, the ion energy of the plasma may be controlled by changing the designed waveform, and thus the distribution of the ion flux according to the ion energy of the plasma may appear over a narrow area. For instance, the ion energy of the plasma may be controlled such that the ion flux corresponding to a first ion energy E1 and the ion flux corresponding to a second ion energy E2 become large.

In an exemplary embodiment, the second power generator 200 includes a plurality of pulse modules 210 and a plurality of slope modules 220 to generate multi-ion energies. The number of the multi-ion energies may be determined based on the number of the semiconductor layers included in the semiconductor structure that is to be etched. For instance, as shown in FIG. 16C, when a semiconductor structure in which first and second semiconductor layers L1 and L2 are stacked is etched, the number of the multi-ion energies may be two.

Referring to FIG. 16C, an etching process is performed on the semiconductor structure including the first semiconductor layer L1 and the second semiconductor layer L2 to form a plurality of protrusions PRc and PRd. In the ion energy distribution shown in FIG. 16B, a linearity of high-energy ions having high energy may be maximized, and thus an etching profile of the semiconductor structure may be improved, and the bowing phenomenon may be reduced. In this case, a difference between an upper distance D2_t between the protrusions PRc and PRd adjacent to each other and a lower distance D2_b between the protrusions PRc and PRd adjacent to each other is relatively small. In detail, the difference between the upper distance D2_t and the lower distance D2_b of the protrusions PRc and PRd adjacent to each other may be smaller than the difference between the upper distance D1_t and the lower distance D1_b of the protrusions PRa and PRb shown in FIG. 15C.

Figure 17:
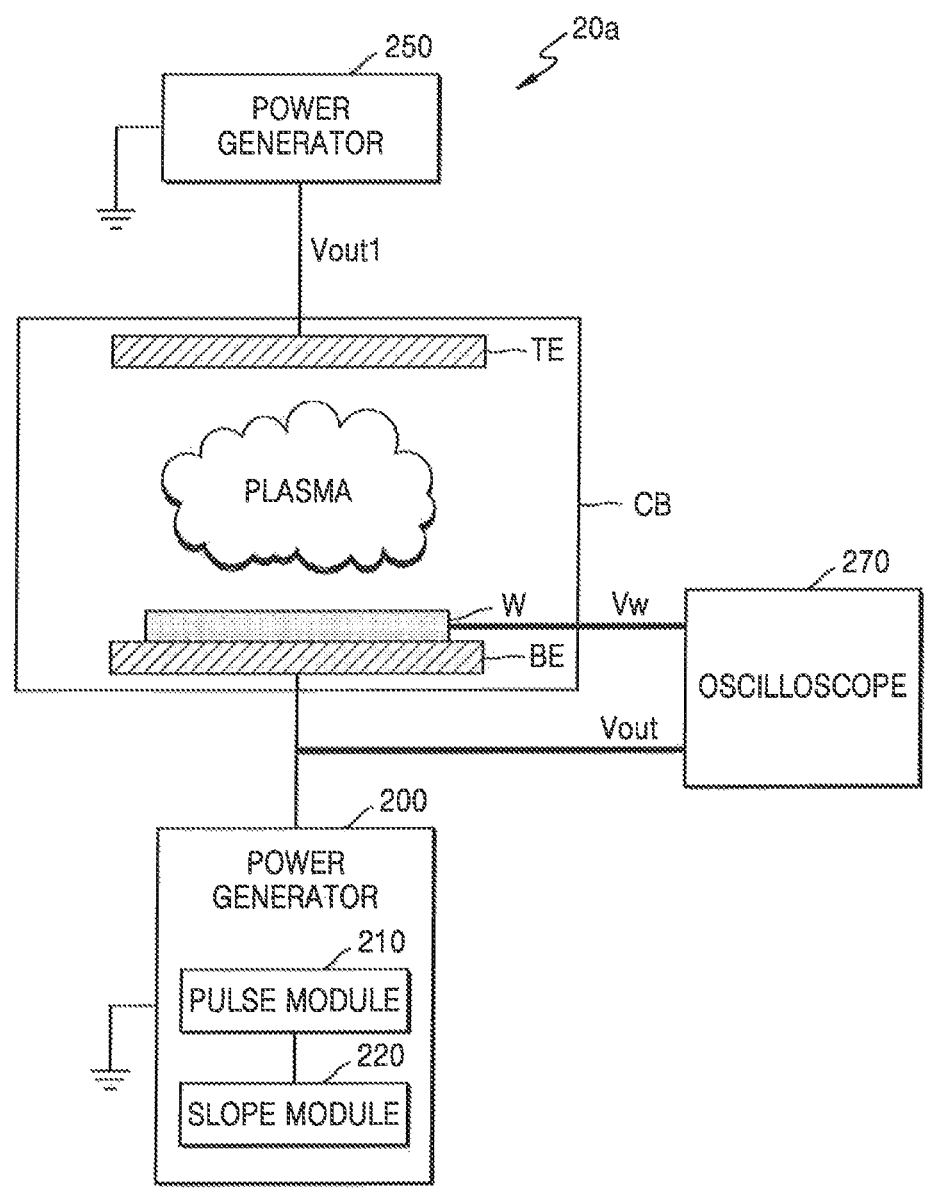
FIG. 17 is a block diagram showing a waveform measurement operation with respect to a plasma processing apparatus according to an exemplary embodiment of the inventive concept.

FIG. 17 is a block diagram showing a waveform measurement operation with respect to a plasma processing apparatus 20a according to an exemplary embodiment of the inventive concept.

Referring to FIG. 17, the plasma processing apparatus 20a further includes an oscilloscope 270 compared to the plasma processing apparatus 20 shown in FIG. 14. The oscilloscope 270 measures an output voltage Vout and a wafer voltage Vw. The output voltage Vout may be a voltage output from the second power generator 200, and the wafer voltage Vw may be a voltage induced to the wafer W (e.g., a wafer made out of a semiconductor material). In this case, the wafer voltage Vw may be measured through an electrode above or disposed on the wafer W while the plasma is generated in the chamber CB.

The second power generator 200 may apply the output voltage Vout having the designed waveform to the bottom electrode BE, and when the output voltage Vout is applied to the bottom electrode BE, the wafer voltage Vw may be induced to the wafer W disposed on the bottom electrode BE. Accordingly, the wafer voltage Vw may be indirectly controlled by controlling the output voltage Vout. According to an exemplary embodiment, the output voltage Vout is provided as the designed waveform having the variable voltage level in at least a portion of a period, and thus the wafer voltage Vw may have the variable voltage in at least a portion of the period.

FIGS. 18A, 19A, 20A, and 21A are graphs showing examples of the output voltage Vout and the wafer voltage Vw, which are measured by the oscilloscope 270 of FIG. 17, and FIGS. 18B, 19B, 20B, and 21B are graphs showing ion energy distributions of the plasma, which respectively correspond to FIGS. 18A, 19A, 20A, and 21A. Hereinafter, an example in which the second power generator 200 shown in FIG. 17 is implemented by the designed waveform generator 100a shown in FIG. 4 is discussed.

Figure 18A:
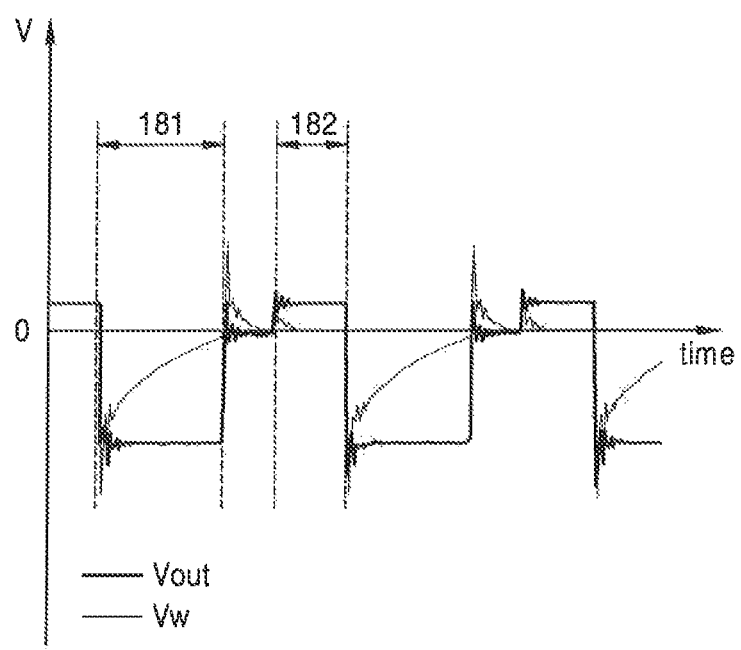
FIGS. 18A, 19A, 20A, and 21A are graphs showing examples of an output voltage and a wafer voltage, which are measured by an oscilloscope of FIG. 17.
Figure 18B:
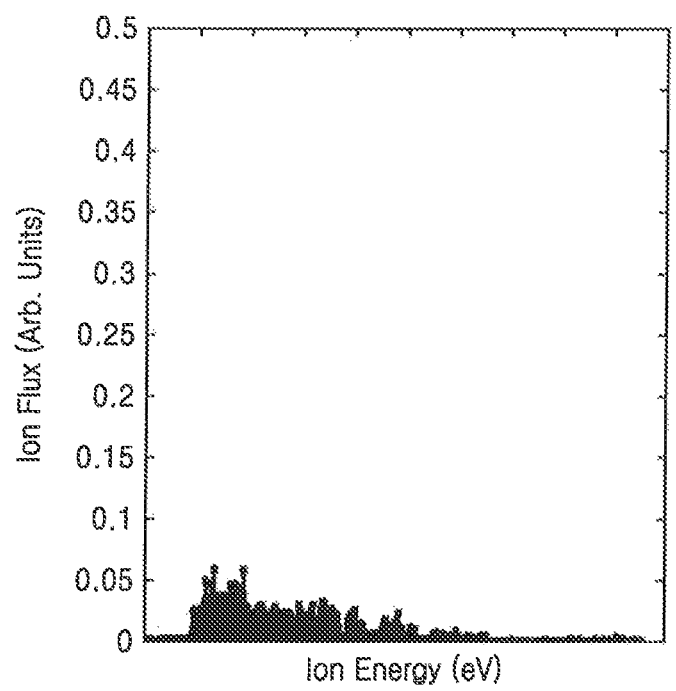
FIGS. 18B, 19B, 20B, and 21B are graphs showing ion energy distributions of the plasma, which respectively correspond to FIGS. 18A, 19A, 20A, and 21A.

Referring to FIG. 18A, when the output voltage Vout is a square wave voltage, a level of the wafer voltage Vw may be reduced as time elapses. In an embodiment, the output voltage Vout is generated to have a constant negative voltage level in a first period 181 and a constant positive voltage level in a second period 182. For instance, the first and second negative pulse modules 112 and 113 may be activated in the first period 181, and the positive pulse module 111 may be activated in the second period 182. Referring to FIG. 18B, the ion energy is distributed over a relatively wide area, and a maximum value of the ion flux is relatively low, e.g., about 0.07.

Figure 19A:
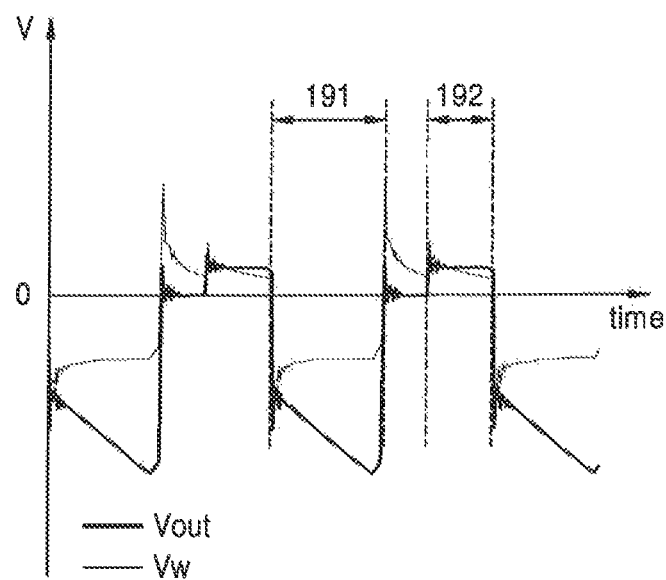

Referring to FIG. 19A, when the output voltage Vout has the designed waveform corresponding to a sum of a square wave voltage and a straight line variable voltage, the level of the wafer voltage Vw may be substantially constantly maintained. In an embodiment, the output voltage Vout is generated to have a negative voltage level increasing along a constant slope in a first period 191 and a constant positive voltage level in a second period 192. For instance, the first and second negative pulse modules 112 and 113 and the slope module 120 may be activated in the first period 191, and the positive pulse module 111 may be activated in the second period 192.

Figure 19B:
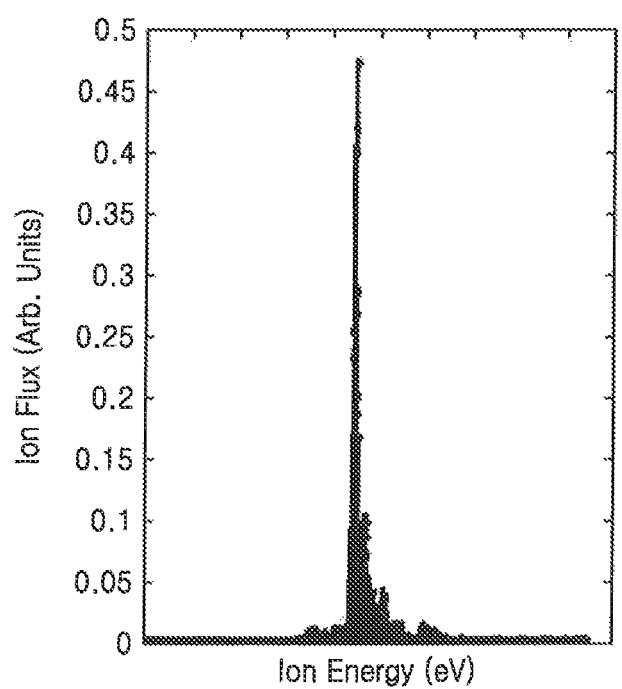

In the first period 191, the slope controller 121 may generate the driving signal $G_S$ having a constant level as the first case 81 shown in FIG. 8A. Since the slope of the output voltage Vout is proportional to the driving signal $G_S$, the slope of the output voltage Vout is constant. Referring to FIG. 19B, the ion energy is distributed over a relatively narrow area, and a maximum value of the ion flux is relatively high, e.g., about 0.47.

Figure 20A:
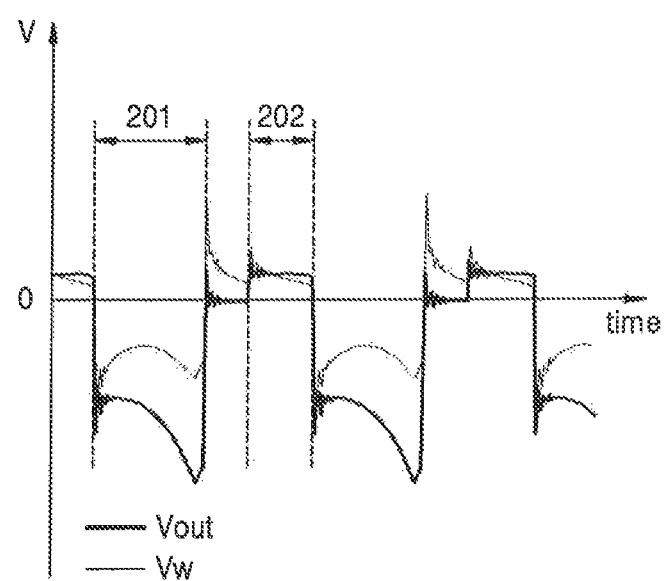

Referring to FIG. 20A, when the output voltage Vout has the designed waveform corresponding to a sum of the square wave voltage and a curved line variable voltage, the level of the wafer voltage Vw may decrease in the beginning stage, but may increase in the later stage. In an embodiment, the output voltage Vout is generated to have a negative voltage level increasing along a slope increasing in a first period 201 and a constant positive voltage level in a second period 202. For instance, the first and second negative pulse modules 112 and 113 and the slope module 120 may be activated in the first period 201, and the positive pulse module 111 may be activated in the second period 202.

Figure 20B:
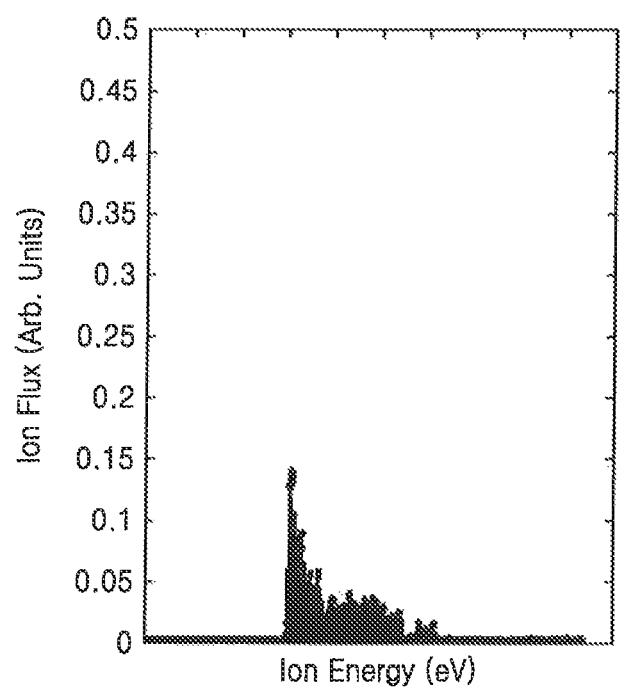

In the first period 201, the slope controller 121 may generate the driving signal $G_S$ having the positive slope as the second case 82 shown in FIG. 8A. Since the slope of the output voltage Vout is proportional to the driving signal $G_S$, the slope of the output voltage Vout increases. Referring to FIG. 20B, the ion flux has the maximum value at a relatively low ion energy.

Figure 21A:
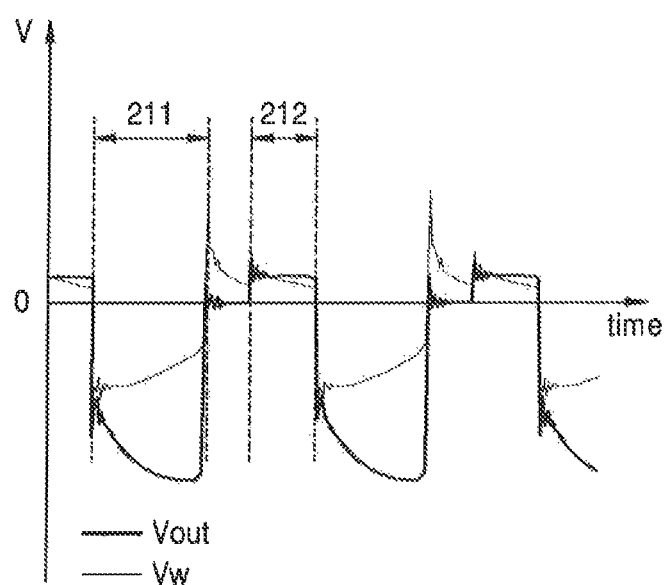

Referring to FIG. 21A, when the output voltage Vout has the designed waveform corresponding to a sum of the square wave voltage and a curved line variable voltage, the level of the wafer voltage Vw may be uniformly maintained in the beginning stage, but may decrease in the later stage. In an embodiment, the output voltage Vout is generated to have a negative voltage level increasing along a slope decreasing in a first period 211 and a constant positive voltage level in a second period 212. For instance, the first and second negative pulse modules 112 and 113 and the slope module 120 may be activated in the first period 211, and the positive pulse module 111 may be activated in the second period 212.

Figure 21B:
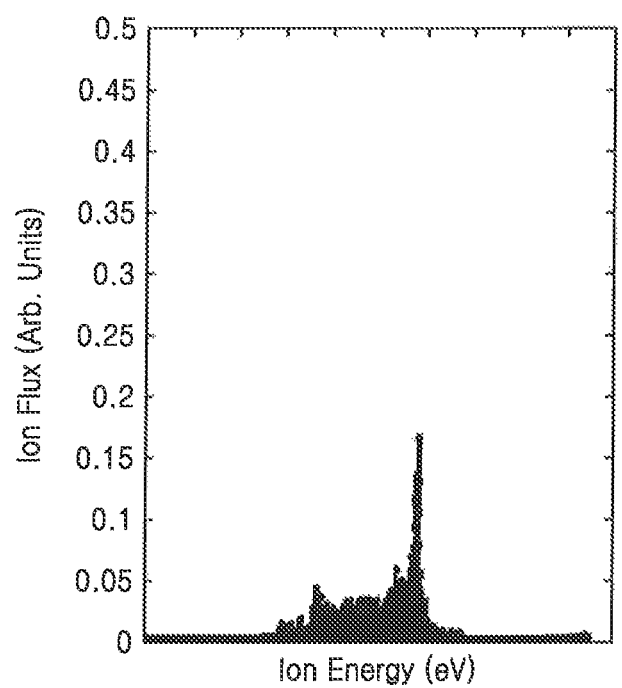

In the first period 211, the slope controller 121 may generate the driving signal $G_S$ having the negative slope as the third case 83 shown in FIG. 8A. Since the slope of the output voltage Vout is proportional to the driving signal $G_S$, the slope of the output voltage Vout decreases. Referring to FIG. 21B, the ion flux has the maximum value at a relatively high ion energy.

As described with reference to FIGS. 18A to 21A and 18B to 21B, the wafer voltage Vw may exert an influence on the ion energy distribution. Consequently, according to at least one embodiment of the inventive concept, since the output voltage Vout is generated using the designed waveform to obtain a desired ion energy distribution, the wafer voltage Vw may be controlled indirectly.

Figure 22:
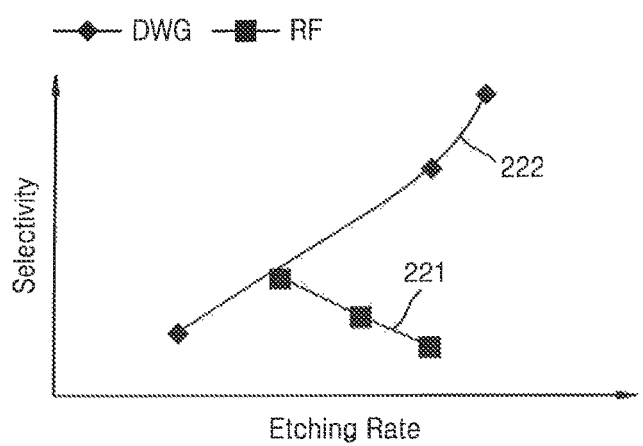
FIG. 22 is a graph showing an etching rate and an etching selectivity according to an exemplary embodiment of the inventive concept.

FIG. 22 is a graph showing an etching rate and an etching selectivity according to an exemplary embodiment of the inventive concept. The graph includes a first curve DWG and a second curve RF.

Referring to FIG. 22, a horizontal axis represents the etching rate, and a vertical axis represents the etching selectivity. A reference number 221 represents the etching rate and the etching selectivity when the RF power is applied to the bottom electrode in the chamber of the plasma processing apparatus according to a comparative example. Meanwhile, a reference number 222 represents the etching rate and the etching selectivity when the high voltage generated by the designed waveform generator and the designed waveform of the high-frequency are applied to the bottom electrode in the chamber of the plasma processing apparatus according to the above-mentioned embodiments.

According to the reference number 221, when the etching rate increases, the etching selectivity decreases. When the RF power is applied to the bottom electrode, the etching rate and the etching selectivity may be in a trade-off relationship. However, according to the reference number 222, the etching rate and the etching selectivity may be substantially simultaneously improved. Accordingly, when the semiconductor structure includes semiconductor layers stacked one on another or when an etching depth in the semiconductor structure is deep (i.e., a deep etching), the etching performance may be greatly improved.

Figure 23:
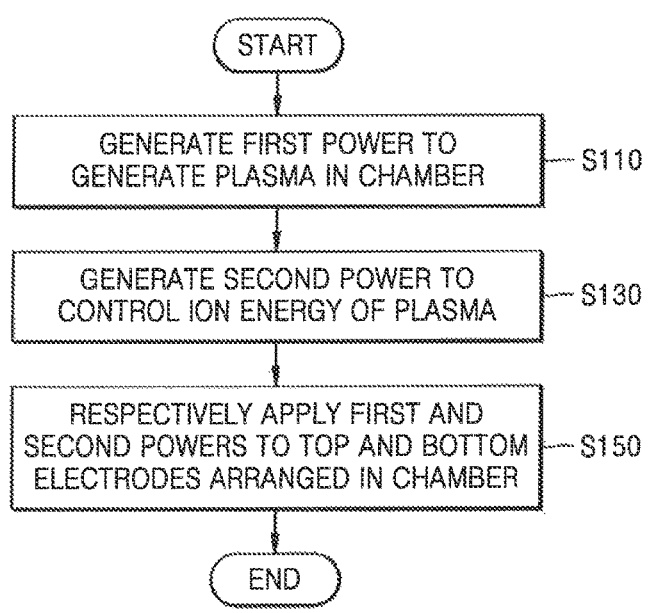
FIG. 23 is a flowchart showing a method of controlling a plasma processing apparatus according to an exemplary embodiment of the inventive concept.

FIG. 23 is a flowchart showing a method of controlling a plasma processing apparatus according to an exemplary embodiment of the inventive concept.

Referring to FIG. 23, the method of controlling the plasma processing apparatus may be a method for applying a power to one of the above-described chambers. For instance, the controlling method according to the present exemplary embodiment may be performed in the plasma processing apparatus 20 shown in FIG. 14. Accordingly, the above-described explanation with reference to FIGS. 14 to 22 may be applied to the present exemplary embodiment.

In operation S110, the first power is generated to generate the plasma in the chamber. For instance, the first power may be the RF power. In operation S130, the second power is generated to control the ion energy of the plasma. In the present exemplary embodiment, the second power may be generated to have the high voltage and the arbitrary waveform of the high-frequency, which are set by the user. In an embodiment, operations S110 and S130 are substantially simultaneously performed. In an embodiment, operations S110 and S130 may be sequentially or reversely performed.

In operation S150, the first and second powers are respectively applied to the top and bottom electrodes arranged in the chamber. Accordingly, an electric field is formed between the top electrode and the bottom electrode, and the reaction gas in the chamber may be converted to the plasma due to the electric field. The semiconductor process may be performed on the wafer loaded in the chamber using the radicals, electrons, and ions, which are activated by the plasma.

Figure 24:
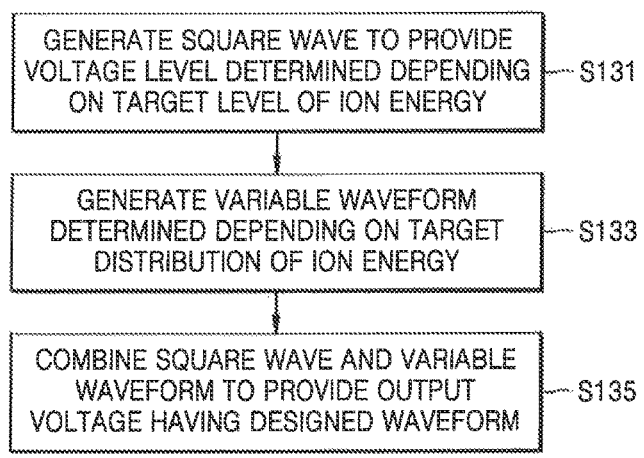
FIG. 24 is a flowchart showing a method of generating a designed waveform according to an exemplary embodiment of the inventive concept.

FIG. 24 is a flowchart showing a method of generating a designed waveform according to an exemplary embodiment of the inventive concept.

Referring to FIG. 24, the method of generating the designed waveform according to the present exemplary embodiment is a method for applying a voltage having an arbitrary waveform designed by a user to the semiconductor equipment. For instance, the generating method of the designed waveform according to the present exemplary embodiment may be performed in the second power generator 200 shown in FIG. 14. Accordingly, the above-described explanation with reference to FIGS. 14 to 22 may be applied to the present exemplary embodiment. In addition, the present exemplary embodiment may correspond to an exemplary implementation of operation S130 shown in FIG. 23.

In operation S131, the square wave is generated to provide the voltage level determined on the basis of a target level of the ion energy. In an embodiment, operation S131 is performed in the pulse module, and the pulse module may include the switching device. In an embodiment, operation S131 is performed in the plurality of pulse modules, where each pulse module may include the independent power source and the switching device. In an embodiment, at least one pulse module among the pulse modules is activated in accordance with the target level of the ion energy, and thus the square wave may be generated. The voltage level of the square wave may be determined depending on the number of the activated pulse modules.

In operation S133, the variable waveform determined depending on a target distribution of the ion energy is generated. In an embodiment, operation S133 is performed in the slope module, and the slope module may include the switching device. In an embodiment, the transition period of the switching device of the slope module is controlled using the current control method, and thus the variable waveform having the variable voltage level may be generated in the on-period of the switching device.

In operation S135, the square wave and the variable waveform are combined with each other to provide the output voltage having the designed waveform. Here, the output voltage may correspond to the second power in operation S130 shown in FIG. 23. According to an exemplary embodiment, the pulse module and the slope module are connected to each other in a cascade manner, and thus the square wave generated by the pulse module may be combined with the variable waveform generated by the slope module.

Figure 25:
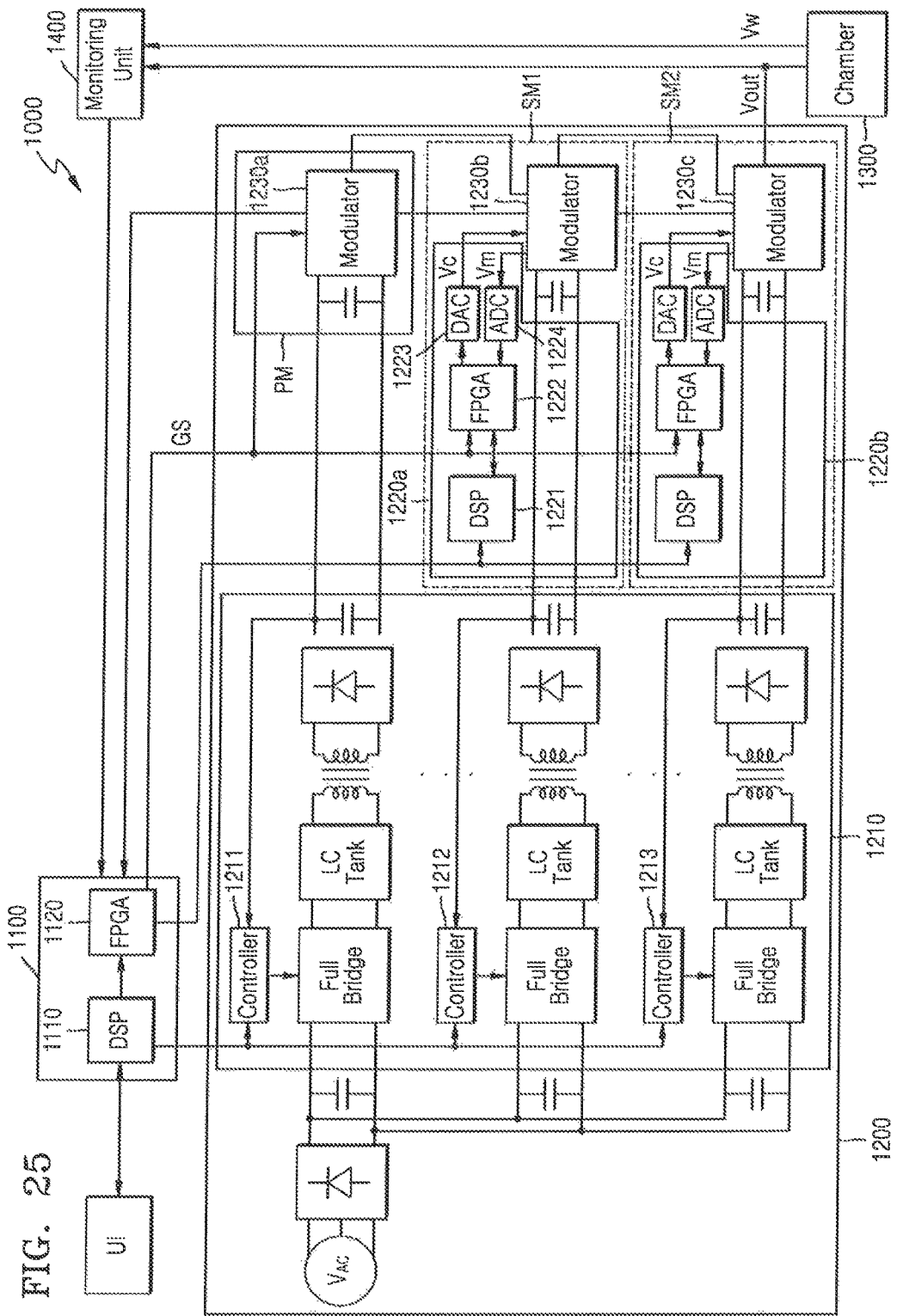
FIG. 25 is a block diagram showing a semiconductor equipment according to an exemplary embodiment of the inventive concept.

FIG. 25 is a block diagram showing semiconductor equipment 1000 according to an exemplary embodiment of the inventive concept.

Referring to FIG. 25, the semiconductor equipment 1000 includes a master controller 1100, a designed waveform generator 1200, a chamber 1300, and a monitoring unit 1400 (e.g., a monitoring device). The designed waveform generator 1200 may include a DC power unit 1210 (e.g., a DC power supply), first and second slope controllers 1220a and 1220b, and first, second, and third modulators 1230a, 1230b, and 1230c.

The master controller 1100 may communicate with a user input device UI (e.g., a computer) and control the designed waveform generator 1200 in response to a user input provided through the user input device UI. The master controller 1100 includes a digital signal processor (DSP) 1110 and a field programmable gate array (FPGA) 1120. The DSP 1110 may control a DC voltage applied to each of the first to third modulators 1230a to 1230c in accordance with the user input. The FPGA 1120 may provide waveform information, such as a slope waveform command, a control state, etc., to each of the first and second slope controllers 1220a and 1220b. In addition, the FPGA 1120 may generate a gate signal GS to drive switches included in the first to third modulators 1230a to 1230c.

The DC power unit 1210 may generate a plurality of DC voltages from an alternating current (AC) voltage $V_{AC}$ and provide the generated DC voltages to the first to third modulators 1230a to 1230c, respectively. In an embodiment, the DC power unit 1210 includes a plurality of controllers 1211, 1212, and 1213, and the DC voltages respectively applied to the first to third modulators 1230a to 1230c are controlled by a control operation of the controllers 1211 to 1213.

The first modulator 1230a may constitute a pulse module PM. In an embodiment, the first modulator 1230a may include switches connected to each other in the half-bridge structure or the full-bridge structure. For instance, the first modulator 1230a may correspond to at least one pulse module 110 shown in FIG. 1. In addition, the first modulator 1230a may include, for example, the first and second switches SW1a and SW1b and the first and second diodes D1a and D1b shown in FIG. 4.

The first slope controller 1220a and the second modulator 1230b may constitute a first slope module SM1, and the second slope controller 1220b and the third modulator 1230c may constitute a second slope module SM2. In an embodiment, the second modulator 1230b includes switches connected to each other in the half-bridge structure or the full-bridge structure. For instance, the first and second slope modules SM1 and SM2 may correspond to at least one slope module 120 shown in FIG. 1. In addition, the second modulator 1230b may include, for example, the first and second switches SW4a and SW4b and the first and second diodes D4a and D4b shown in FIG. 4.

The first slope controller 1220a includes a DSP 1221, an FPGA 1222, a digital/analog converter (DAC) 1223, and an analog/digital converter (ADC) 1224. The DSP 1221 may control the FPGA 1222 in accordance with the waveform information provided from the FPGA 1120 of the master controller 1100. The FPGA 1222 may generate the driving signal to control a slope voltage output from a first slope module SM1 in accordance with the control of the DSP 1221. In addition, the FPGA 1222 may generate a gate current control voltage command required to generate the waveform by using the gate signal GS as a trigger signal. The DAC 1223 may convert the gate current control voltage command to an analog voltage, and the converted voltage may correspond to the voltage Vc shown in FIG. 7. The ADC 1224 may convert an output voltage Vm of the second modulator 1230b to a digital voltage and apply the digital voltage to the FPGA 1222, and thus the ADC 1224 may perform a feedback control. The second slope controller 1220b may have substantially the same configuration as that of the first slope controller 1220a.

The monitoring unit 1400 may measure an output voltage Vout of the designed waveform generator 1200 and a wafer voltage Vw in the chamber 1300. In addition, the monitoring unit 1400 may apply the measured output voltage Vout and the measured wafer voltage Vw to the user input device UI through the master controller 1100. Further, the master controller 1100 may change a control operation with respect to the controllers 1211 to 1213 and the first and second slope controllers 1220a and 1220b based on the output voltage Vout and the wafer voltage Vw.

Figure 26:
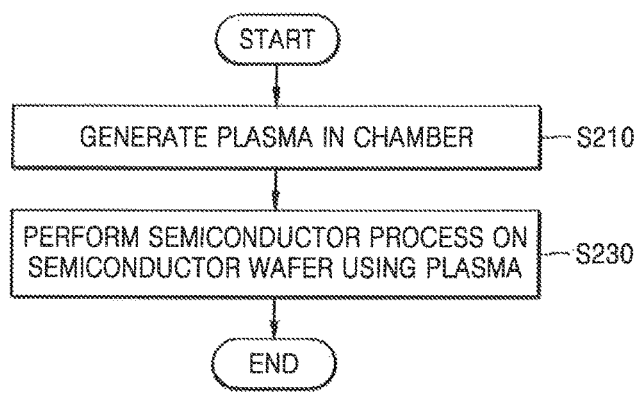
FIG. 26 is a flowchart showing a method of manufacturing a semiconductor device according to an exemplary embodiment of the inventive concept.

FIG. 26 is a flowchart showing a method of manufacturing a semiconductor device according to an exemplary embodiment of the inventive concept.

Referring to FIG. 26, the manufacturing method of the semiconductor device according to the present exemplary embodiment is a method for performing a semiconductor process in a plasma processing apparatus. For instance, the manufacturing method of the semiconductor device according to the present exemplary embodiment may be performed in the plasma processing apparatus 20 shown in FIG. 14. Accordingly, the above explanation described with reference to FIGS. 14 to 22 may be applied to the present exemplary embodiment.

In operation S210, the plasma is generated in the chamber. For instance, operation S210 may correspond to the control method of the plasma processing apparatus shown in FIG. 23. In detail, operation S210 may include generating the first power to generate the plasma, generating the second power to control the ion energy of the plasma, and respectively applying the first and second powers to the top electrode and the bottom electrode, which are arranged in the chamber. For instance, the generating the second power may correspond to the designed waveform generating method shown in FIG. 24. In detail, the generating the second power may include generating the square wave to provide the voltage level determined depending on the target level of the ion energy, generating the variable waveform determined depending on the target distribution of the ion energy, and combining the square wave and the variable waveform to provide the second power having the designed waveform.

In operation S230, the semiconductor process is performed on the semiconductor wafer using the generated plasma. For instance, the semiconductor process may include a wafer processing process, such as a plasma annealing process, an etching process, a plasma enhanced chemical vapor deposition process, a physical vapor deposition process, a plasma cleaning process, etc.

While the inventive concept has been particularly shown and described with reference to embodiments thereof, it will be understood that various changes in form and details may be made therein without departing from the spirit and scope of the inventive concept.

What is claimed is:

1. A designed waveform generator for semiconductor equipment, comprising:
    at least one first signal generator comprising a first switching device and configured to generate a square wave having a constant voltage level during an on-period of the first switching device; and
    at least one second signal generator comprising a second switching device and configured to control a transition period of the second switching device to generate a variable waveform having a variable voltage level during the transition period of the second switching device, wherein the at least one first signal generator and the at least one second signal generator are connected to each other in a cascade manner, wherein the designed waveform generator generates an output voltage having a designed waveform corresponding to a sum of the square wave and the variable waveform.

2. The designed waveform generator of claim 1, wherein the at least one first signal generator further comprises a first direct current (DC) power source connected to the first switching device, the at least one second signal generator further comprises a second DC power source connected to the second switching device, and the first and second DC power sources are independent power sources that do not share a ground terminal.

3. The designed waveform generator of claim 2, wherein the at least one second signal generator further comprises a controller that applies a driving signal to the second switching device to control the transition period of the second switching device.

4. The designed waveform generator of claim 3, wherein the output voltage has a slope proportional to the driving signal.

5. The designed waveform generator of claim 3, wherein the second switching device is implemented by a power semiconductor device, and the driving signal drives the power semiconductor device using a current control method.

6. The designed waveform generator of claim 3, wherein the controller comprises:
a current source configured to generate a reference current based on a control voltage; and
a current mirror configured to mirror the reference current and provide the mirrored current as the driving signal.

7. The designed waveform generator of claim 6, wherein the current source comprises:
a buffer configured to buffer the control voltage;
a transistor comprising a control terminal to which the buffered control voltage is applied; and
a resistor connected to an output terminal of the transistor, and the reference current is a current flowing through the resistor.

8. The designed waveform generator of claim 3, wherein the second switching device is connected to a negative terminal of the second DC power source, and the variable waveform is generated to have a voltage level decreasing as time elapses.

9. The designed waveform generator of claim 1, wherein the at least one first signal generator further comprises a gate driver that applies a gate driving signal to the first switching device to control an on/off operation of the first switching device.

10. The designed waveform generator of claim 1, wherein the at least one first signal generator comprises:
at least one positive pulse generator configured to generate a positive pulse voltage; and
at least one negative pulse generator configured to generate a negative pulse voltage and connected to the at least one positive pulse generator in the cascade manner.

11. The designed waveform generator of claim 10, wherein the at least one positive pulse generator comprises a first direct current (DC) power source and a first switch connected to a positive terminal of the first DC power source and driven by a first gate driving signal, and when the first gate driving signal is activated, the first switch is turned on, and the at least one positive pulse generator generates the positive pulse voltage having a voltage level corresponding to the first DC power source.

12. The designed waveform generator of claim 11, wherein the at least one negative pulse generator comprises a second DC power source and a second switch connected to a negative terminal of the second DC power source and driven by a second gate driving signal, and when the second gate driving signal is activated, the second switch is turned on, and the at least one negative pulse generator generates the negative pulse voltage having a voltage level corresponding to the second DC power source.

13. The designed waveform generator of claim 1, wherein a designed waveform corresponding to a sum of the square wave and the variable waveform has a maximum output voltage determined depending on a number of the first signal generators and a number of the second signal generators.

14. A plasma processing apparatus comprising:
a chamber;
a top electrode and a bottom electrode, which are disposed in the chamber;
a first power generator configured to apply a first signal to the top electrode to generate plasma in the chamber; and
a second power generator configured to apply a second signal to the bottom electrode to control ion energy of the plasma, wherein the second power generator comprises at least one first signal generator configured to generate a square wave and at least one second signal generator configured to generate a slope voltage comprising a variable waveform during high periods of the square wave and comprising a constant voltage during low levels of the square wave, and the second signal has a designed waveform corresponding to a sum of the square wave and the variable waveform,
wherein the at least one first signal generator is connected to the at least one second signal generator in a cascade manner.

15. The plasma processing apparatus of claim 14, wherein an intensity of the ion energy is determined depending a number of the at least one first signal generators and a number of the at least one second signal generators, and a distribution of the ion energy is determined depending on the slope voltage.

16. The plasma processing apparatus of claim 14, wherein the at least one second signal generator further comprises a switching device and controls a transition period of the switching device to generate the variable waveform having a variable voltage level during the transition period of the switching device.

17. The plasma processing apparatus of claim 14, wherein the at least one first signal generator comprises a first switching device and a first direct current (DC) power source connected to the first switching device, the at least one second signal generator comprises a second switching device and a second DC power source connected to the second switching device, and the first and second DC power sources are independent power sources that do not share a ground terminal.

18. A plasma processing apparatus comprising:
a chamber;
a top electrode and a bottom electrode, which are disposed in the chamber;
a first power generator configured to apply a first signal to the top electrode to generate plasma in the chamber; and a second power generator configured to apply a second signal to the bottom electrode to control ion energy of the plasma, wherein the second power generator comprises:
- a first signal generator configured to generate a square wave; and
- a second signal generator including a transistor comprising an input terminal configured to receive the square wave as an input,
- wherein an output terminal of the transistor provides the second signal as periodic waveform having an increasing or decreasing slope when the first signal generator is inactivated, and
- wherein the output terminal provides the second signal as a sum of the square wave and the periodic waveform when the first signal generator is activated.

19. The plasma processing apparatus of claim 18, wherein the square wave has high periods and low periods, the second signal generator is activated during the high periods and inactivated during the low periods.

* * * * *